(12) United States Patent
Shiraishi

(10) Patent No.: US 7,603,611 B2
(45) Date of Patent: Oct. 13, 2009

(54) MAXIMUM LIKELIHOOD DECODING DEVICE, SIGNAL EVALUATING METHOD, AND REPRODUCING APPARATUS

(75) Inventor: Junya Shiraishi, Kanagawa (JP)

(73) Assignee: Sony Corporation, Tokyo (JP)

( * ) Notice: Subject to any disclaimer, the term of this patent is extended or adjusted under 35 U.S.C. 154(b) by 623 days.

(21) Appl. No.: 11/393,861

(22) Filed: Mar. 31, 2006

(65) Prior Publication Data
US 2007/0234188 A1 Oct. 4, 2007

(30) Foreign Application Priority Data
Mar. 31, 2005 (JP) ............................. 2005-103278

(51) Int. Cl.
*H03M 13/03* (2006.01)
(52) U.S. Cl. ...................... 714/794; 714/795; 714/796; 375/262; 375/341
(58) Field of Classification Search ................. 714/794, 714/795, 796; 375/262, 341
See application file for complete search history.

(56) References Cited
U.S. PATENT DOCUMENTS 5,995,561 A * 11/1999 Yamasaki et al. ........... 375/341
6,028,727 A * 2/2000 Vishakhadatta et al. ....... 360/51
6,546,518 B1 * 4/2003 Leung et al. ................ 714/769
6,901,118 B2 * 5/2005 Hocevar et al. ............. 375/341
6,980,385 B2 * 12/2005 Kato et al. .................... 360/39
7,243,297 B2 * 7/2007 Kochale et al. ............. 714/809
7,308,640 B2 * 12/2007 Parhi et al. .................. 714/795
7,327,658 B2 * 2/2008 Mouri et al. ............. 369/53.33

FOREIGN PATENT DOCUMENTS

| JP | H03-033238 B | 11/1992 |
| JP | 10-021651 | 1/1998 |
| JP | 2003-141823 | 5/2003 |
| JP | 2003-151220 | 5/2003 |
| JP | 2003-178537 | 6/2003 |

* cited by examiner

*Primary Examiner*—Esaw T Abraham
(74) *Attorney, Agent, or Firm*—Rader, Fishman & Grauer PLLC; Christopher M. Tobin

(57) ABSTRACT

The invention relates to a maximum likelihood decoding device that performs Partial Response Maximum Likelihood decoding on a reproduced data signal from a recording media or another source. The device includes a Viterbi detector that performs bit detection from the reproduced signal. The Viterbi device can have variable setting for branch metric calculations based on the reference levels in the reproduced signal. The device measures and attempts to reduce the Euclidean distance between a maximum likelihood path selected by the Viterbi detector and a second path.

9 Claims, 9 Drawing Sheets

LARGE MD ⇔ PROBABLE

SMALL MD ⇔ STRONG POSSIBILITY OF ERRONEOUS DETECTION

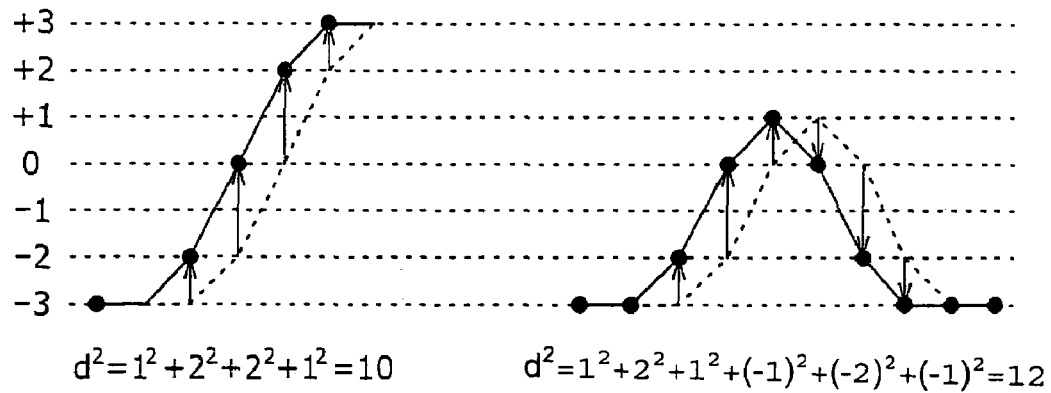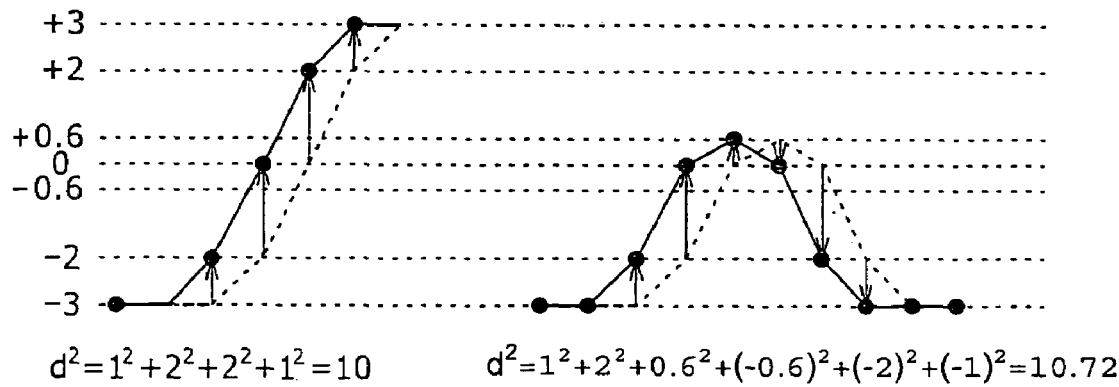

FIG. 9

|  | PR (1,1) | PR (1,2,1) | PR (1,2,2,1) | PR (1,2,2,2,1) |
|---|---|---|---|---|
| 1bit error 00001000 | 2 | 6 | 10 | 14 |
| 2bit error 00011000 | 6 | 20 | 36 | 52 |
| 2bit error 00010-1000 | 4 | 10 | 12 | 12 |

IDEAL PR1221 SIGNAL AND REFERENCE LEVELS

ADAPTATION TO INPUT SIGNAL HAVING LOW 2T LEVEL
(R-Lvc, R-Lve)

MAXIMUM LIKELIHOOD DECODING DEVICE, SIGNAL EVALUATING METHOD, AND REPRODUCING APPARATUS

CROSS REFERENCES TO RELATED APPLICATIONS

The present invention contains subject matter related to Japanese Patent Application P2005-103278 filed with the Japanese Patent Office on Mar. 31, 2005, the entire contents of which being incorporated herein by reference.

BACKGROUND OF THE INVENTION

The present invention relates to a maximum likelihood decoding device that performs PRML (Partial Response Maximum Likelihood) decoding processing on a reproduced signal from a recording medium, for example, and a reproducing apparatus that has such a maximum likelihood decoding device and reproduces information recorded on a recording medium. The present invention also relates to a signal evaluating method in a maximum likelihood decoding device.

[Patent Document 1]
Japanese Patent Laid-Open No. Hei 10-21651
[Patent Document 2]
Japanese Patent Laid-Open No. 2003-141823
[Patent Document 3]
Japanese Patent Laid-Open No. 2003-151220
[Patent Document 4]
Japanese Patent Laid-Open No. 2003-178537

For example, as a method for evaluating signal quality of a reproduced signal from an optical disk, a method of evaluating time interval jitter (TI jitter) is known. TI jitter refers to variations (jitter) in time difference (time interval) between timing of a binary-level analog signal obtained by inputting a reproduced signal and a bit determination level to a comparator and timing of an edge of a clock synchronously reproduced from the reproduced signal.

Such a method of evaluating signal quality using TI jitter has been used as an evaluation method correlated to a bit error rate because in bit detection using an analog binary signal, variations in timing of edges of the binary signal directly affect the bit error rate. For CDs (Compact Discs), DVDs (Digital Versatile Discs) and the like using such analog binary detection, in particular, the method of evaluating signal quality using TI jitter has been widely used as a very effective signal evaluation method.

On the other hand, it has recently been confirmed that the above-described bit detection using an analog binary signal cannot secure a sufficiently low bit error rate as the density of information recorded on optical disks has been increased. For a Blu-Ray Disc or the like, as a higher-density optical disk, in particular, a method referred to as PRML (Partial Response Maximum Likelihood) detection is now common as a bit detection method.

PRML is a technology that combines a process of partial response and a technology of maximum likelihood detection. Partial response refers to a process of returning an output longer than one bit in response to a one-bit input, that is, a process of making a determination by a plurality of input bits of the output. In particular, a process of obtaining a reproduced signal as a signal obtained by multiplying an input of four consecutive information bits by 1, 2, 2, and 1 in this order and adding the results, as often used for optical disks such as the Blu-Ray Disc and the like, is expressed as PR(1, 2, 2, 1).

Maximum likelihood detection is a method of defining a distance referred to as a path metric between two signal strings, determining a distance between an actual signal and a signal predicted from an assumed bit sequence, and detecting a bit sequence providing the closest distance. Incidentally, the path metric is defined as a distance obtained by adding the squares of differences in amplitude between two signals at same times over a whole time. Viterbi detection is used to search for the bit sequence providing the closest distance.

Partial response maximum likelihood combining these methods is a method of adjusting a signal obtained from bit information on a recording medium such that the signal is in a partial response process by a filter referred to as an equalizer, determining a path metric between the resulting reproduced signal and the partial response of an assumed bit sequence, and detecting a bit sequence providing the closest distance.

An algorithm based on the above-mentioned Viterbi detection is effective in actually searching for a bit sequence providing a minimum path metric.

For the Viterbi detection, a Viterbi detector including a plurality of states formed with consecutive bits of a predetermined length as a unit and branches represented by transitions between the states is used, and is configured to detect a desired bit sequence efficiently from among all possible bit sequences.

An actual circuit is provided with two registers, that is, a register referred to as a path metric register for each state, for storing a path metric between a partial response sequence and a signal up to the state, and a register referred to as a path memory register, for storing a flow of a bit sequence (path memory) up to the state. The circuit is also provided with an operation unit referred to as a branch metric unit for each branch, for calculating a Euclidean distance between a partial response sequence and a signal at the bit.

The Viterbi detector can bring various bit sequences into one-to-one correspondence with individual paths passing through the above-described states. A path metric between a partial response sequence passing through these paths and an actual signal (reproduced signal) is obtained by sequentially adding together the above-mentioned branch metrics of interstate transitions forming the paths, that is, branches.

Further, a path that minimizes the above-described Euclidean distance can be selected by comparing the magnitudes of path metrics of two branches or less reached in each state, and sequentially selecting a path with a smaller path metric. Information on this selection is transferred to the path memory register, whereby information representing a path reaching each state by a bit sequence is stored. The value of the path memory register ultimately converges to a bit sequence that minimizes the path metric while being updated sequentially, and the result is output.

Thus, it is possible to search efficiently for a bit sequence that produces a partial response sequence closest to the reproduced signal as described above from a viewpoint of the path metric.

The bit detection using PRML is not directly affected by TI jitter as fluctuation in the direction of a time base. That is, TI jitter does not necessarily have a correlation with a bit error rate in the bit detection using PRML, and thus is not necessarily appropriate as an index of signal quality.

In the case of PRML, fluctuation in the direction of an amplitude axis has a direct relation to the bit error rate in the bit detection. Hence, for the bit detection using PRML, an index incorporating fluctuation in the direction of an amplitude axis is desirable as a conventional index corresponding to the bit error rate.

As described above, the method of bit detection by PRML is an algorithm that compares the magnitudes of a Euclidean distance between a partial response sequence obtained from a correct bit sequence and a reproduced signal and a Euclidean distance between a partial response sequence obtained from an erroneous bit sequence and the reproduced signal, retains a closer path, that is, a path with a smaller path metric as a more likely path, and sets a path ultimately surviving after repetition of this operation (maximum likelihood path) as a result of detection.

According to such an algorithm, a large difference between the path metrics of the two closest paths (suppose that the two closest paths are a maximum likelihood path Pa and a second path Pb) with smallest path metric values as candidates selected for the ultimately surviving path indicates that the surviving path is more likely, whereas a small difference between the path metrics of the two closest paths indicates that the surviving path is more unlikely, that is, there is a stronger possibility of an detection error (see FIGS. 6A and 6B).

In other words, correct bit detection is performed when the path metric for the maximum likelihood path is smaller than the path metric for the second path. On the other hand, an error occurs when the path metric for the maximum likelihood path is larger than the path metric for the second path.

Thus, the capability of the PRML bit detection and consequently the signal quality of the reproduced signal can be determined on the basis of difference between the former path metric and the latter path metric.

That is, the difference between the path metric for the maximum likelihood path and the path metric for the second path is effectively used as an index corresponding to the bit error rate in PRML. Specifically, statistical information based on, for example, a variance value of such a metric difference is used.

SUMMARY OF THE INVENTION

The conventional method of signal quality evaluation based on the variance value of the metric difference assumes that fixed values of reference levels are set in a Viterbi detector. That is, the conventional method of signal quality evaluation is intended for only Viterbi detectors in which fixed values are set as reference levels for branch metric calculation. Thus, in the present situation, a Euclidean distance given by a path metric between codes of the maximum likelihood path and the second path, which distance is used to normalize the variance value of the metric difference, which value is necessary to calculate an evaluation value, is also handled as a fixed value.

However, an adaptive type Viterbi technology has recently been proposed and started to be used as an improved technology of the Viterbi detector, which technology dynamically changes internal reference levels according to a reproduced signal.

FIGS. 10A and 10B show a relation between reference levels set in a Viterbi detector (PRML detector) and a reproduced signal (eye pattern) when PR(1, 2, 2, 1), for example, is employed as a partial response type.

FIG. 10A shows a case where the amplitude levels in the reproduced signal of mark lengths corresponding to the respective reference levels (R-Lva to R-Lvg in the figure) in PR employed by the Viterbi detector are normally distributed and an ideal reproduced signal expected in the PR type is obtained.

On the other hand, FIG. 10B shows a case where the reproduced signal of a shortest mark length, in particular, cannot obtain a sufficient amplitude as, for example, the recording density of the recording medium is increased.

In such a case, each reference level (the reference level R-Lvc and the reference level R-Lve represented by broken lines in FIG. 10B) to be set in correspondence with the shortest mark length becomes a shifted value with respect to actual signal amplitude distribution. Thus, a reproduced signal waveform different from an ideal waveform expected in the PR is obtained, and correspondingly the reference levels are shifted. An error, therefore, occurs in a branch metric calculated on the basis of the reference levels. Thereby an error may also be caused in a result of detection of the Viterbi detector.

Accordingly, the adaptive type Viterbi technology suppresses errors in the bit detection result by generating reference levels according to an actual reproduced signal by, for example, calculating an average value of each distribution in the reproduced signal, and using the reference levels for branch metric calculation.

However, in such adaptive type Viterbi detection, the reference levels varied as described above can cause a variation in Euclidean distance between two specific paths. That is, a Euclidean distance between the maximum likelihood path and the second path can thereby be changed.

Thus, when combined with the adaptive type Viterbi technology, a signal quality evaluation value calculated by using the above-described conventional method, that is, by using a fixed Euclidean distance can be greatly deteriorated in accuracy.

Accordingly, in view of the above-described problems, a maximum likelihood decoding device according to an embodiment of the present invention is configured as follows.

The maximum likelihood decoding device first includes a Viterbi detecting section for performing bit detection by performing Viterbi detection from a reproduced signal in which bit information is reproduced, the Viterbi detecting section variably setting reference levels used for branch metric calculation according to level of the reproduced signal.

Then, the maximum likelihood decoding device includes a Euclidean distance calculating section for calculating a Euclidean distance between a maximum likelihood path as a path surviving as a result of path selection by the Viterbi detecting section and a second path compared finally with the maximum likelihood path.

In addition, the maximum likelihood decoding device includes a metric difference calculating section for calculating a metric difference between a value of a path metric for the second path and a value of a path metric for the maximum likelihood path on the basis of the reproduced signal, the maximum likelihood path, and the second path.

In addition, the maximum likelihood decoding device includes a sample average value calculating section for sampling a value of the Euclidean distance between the maximum likelihood path and the second path, the Euclidean distance being calculated by the Euclidean distance calculating section, and calculating an average value of the Euclidean distance.

In addition, the maximum likelihood decoding device includes a variance value calculating section for calculating a variance value of the metric difference calculated by the metric difference calculating section.

As described above, according to the present invention, the Euclidean distance between the maximum likelihood path and the second path is actually calculated. That is, according to the present invention, the variance value of the metric difference can be normalized on the basis of the Euclidean distance thus actually calculated.

Thus, according to the present invention, the variance value of the metric difference can be normalized on the basis of the actually calculated Euclidean distance between the maximum likelihood path and the second path. That is, according to the present invention, even when an adaptive type Viterbi detection method is employed, so that the values of reference levels are varied and accordingly the value of the Euclidean distance becomes different from an assumed value, the variance value of the metric difference can be normalized on the basis of the value of the actually calculated Euclidean distance.

As a result, a signal quality evaluation value can be calculated properly even when an adaptive type Viterbi detection method is employed.

BRIEF DESCRIPTION OF THE DRAWINGS

FIGS. 7A and 7B are diagrams showing an example where ideal reference levels are set, as diagrams of assistance in explaining a Euclidean distance between a maximum likelihood path and a second path in a case of a one-bit error and a Euclidean distance between a maximum likelihood path and a second path in a case of a two-bit error caused by a shift of a shortest mark;

FIGS. 8A and 8B are diagrams showing an example where the reference levels are changed from ideal values, as diagrams of assistance in explaining a Euclidean distance between a maximum likelihood path and a second path in a case of a one-bit error and a Euclidean distance between a maximum likelihood path and a second path in a case of a two-bit error caused by a shift of a shortest mark;

FIG. 9 is a diagram showing the values of Euclidean distances between a maximum likelihood path and a second path for each error type by PR type.

DETAILED DESCRIPTION OF THE PREFERRED EMBODIMENTS

The best mode for carrying out the present invention (hereinafter referred to as embodiments) will hereinafter be described.

Figure 1:
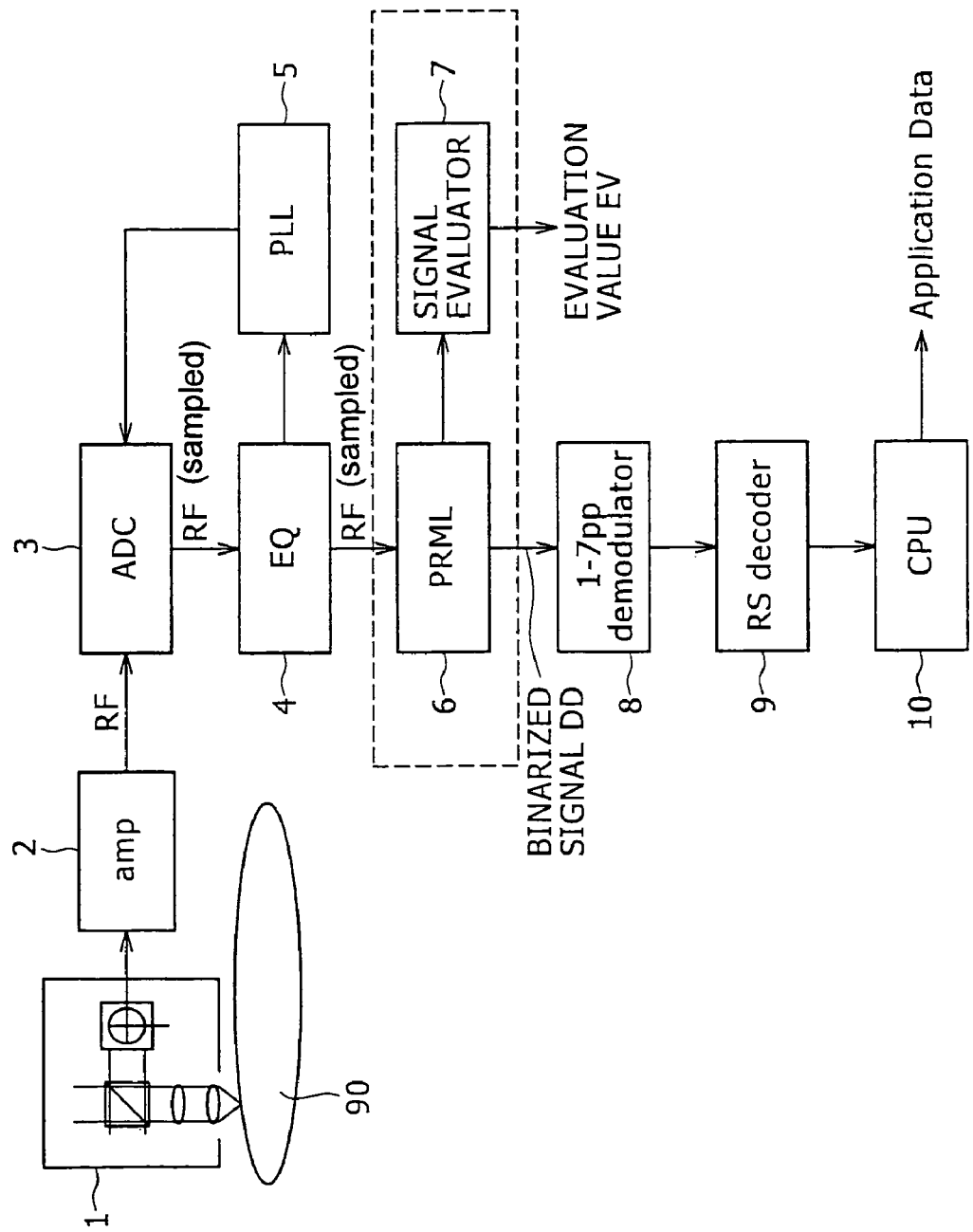
FIG. 1 is a block diagram showing an example of a configuration of a reproducing apparatus according to an embodiment of the present invention.

FIG. 1 is a block diagram showing an outline of a reproduction device according to a first embodiment of the present invention.

As shown in FIG. 1, the reproduction device according to the present embodiment includes a recording medium 90 in the form of a disk such as an optical disk or the like, an optical pickup 1 for reproducing bit information from the recording medium 90, and a preamplifier 2 for converting the signal read by the optical pickup 1 into a reproduced signal (RF signal).

The reproduction device further includes an A/D converter 3 for subjecting the reproduced signal RF to A/D conversion, an equalizer 4 for adjusting the waveform of the reproduced signal RF for PLL (Phase Locked Loop) processing, and a PLL circuit 5 for reproducing a clock from the reproduced signal RF.

The reproduction device further includes a PRML (Partial Response Maximum Likelihood) decoder 6 (Viterbi detector) for detecting bit information from the reproduced signal RF and thereby obtaining a binarized signal DD, and a signal evaluator 7 for calculating an evaluation value EV of quality of the reproduced signal on the basis of information from the PRML decoder 6.

The reproduction device further includes, for example, a demodulator 8 such as an RLL (1-7) pp demodulator for demodulating bit information on the basis of the binarized signal DD, an RS decoder 9 for correcting errors in the demodulated information, and a CPU (Central Processing Unit) block 10 for reproducing application data by processing the error-corrected information.

The reproduced signal RF obtained through the optical pickup 1 and the preamplifier 2 is subjected to digitalization sampling by the A/D converter 3 (RF (Sampled)). This sampling is performed in the same timing as the clock synchronous with a channel bit reproduced by the PLL circuit 5.

The sampling information of the sampled reproduced signal RF is adjusted in waveform by the equalizer 4, and thereafter input to the PRML decoder 6, so that bit information is detected.

Suppose in this case that PRML is configured to satisfy a D1 constraint (a minimum run length d=1 and a shortest mark length of 2T) according to a constraint of a modulation system at the time of recording, and that a PRML target response (PRML type) is PR(1, 2, 2, 1) or PR(1, 2, 2, 2, 1).

The bit information obtained by the PRML decoder 6 is supplied as binarized signal DD to the demodulator 8 to be demodulated in the demodulator 8 according to the modulation system at the time of recording. Further, the RS decoder 9 decodes the Reed-Solomon code of an ECC block, and corrects errors. The CPU block 10 confirms that no error is detected in error detecting code in an EDC block, whereby original application data is restored. That is, reproduced data is thereby obtained.

Incidentally, the PRML decoder 6 in the present embodiment is configured as a so-called adaptive type Viterbi detector that adaptively changes the value of each reference level for branch metric calculation on the basis of the amplitude level of the input reproduced signal RF.

The signal evaluator 7 is configured at least to provide an evaluation value EV of quality of the reproduced signal on the basis of the reproduced signal RF obtained from an equalizer (to be described later) within the PRML decoder 6, the reference levels generated adaptively to the reproduced signal RF as described above in the PRML decoder 6, and the binarized signal DD. The quality of the signal is evaluated on the basis of the evaluation value EV.

Figure 2:
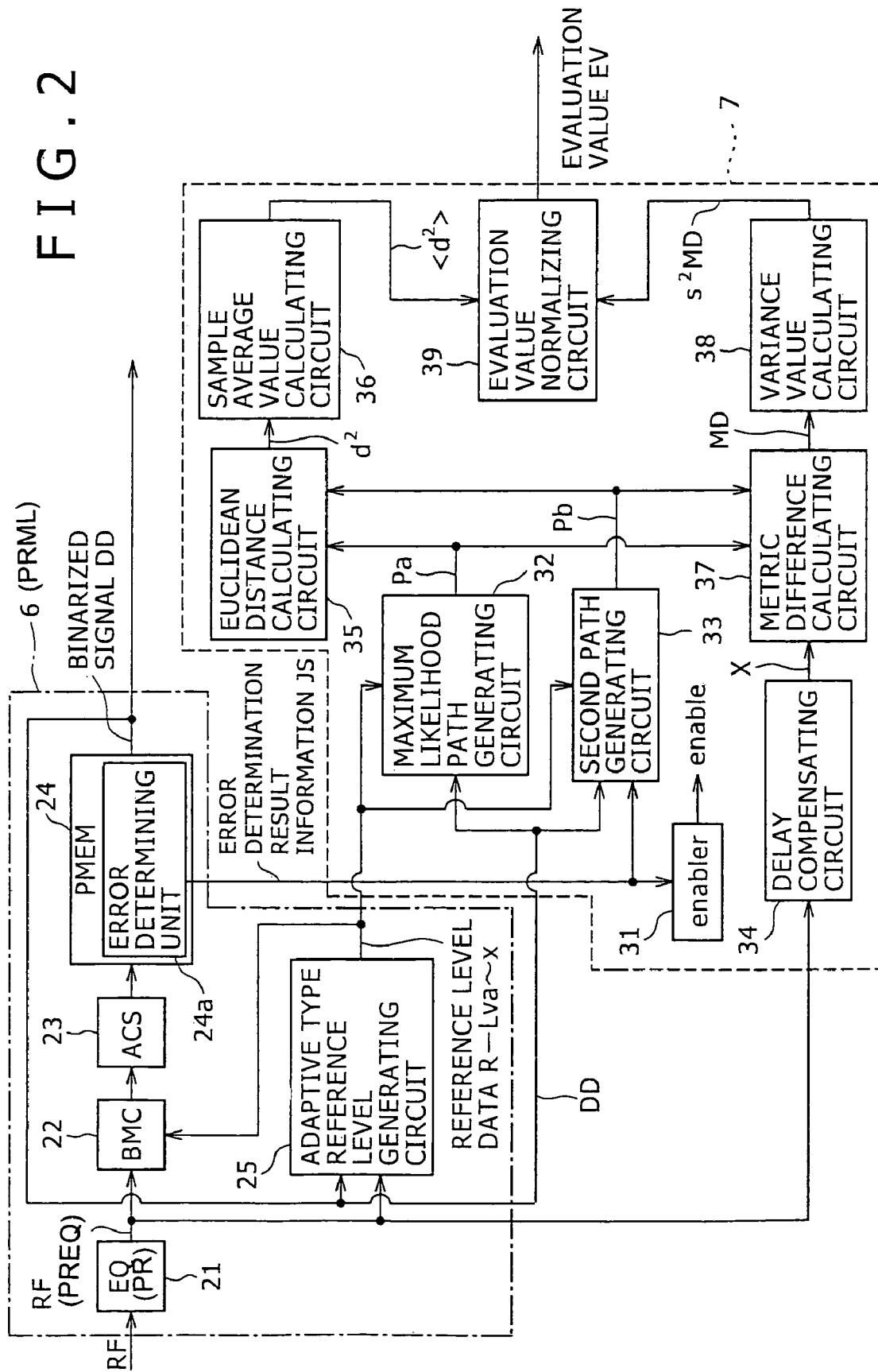
FIG. 2 is a block diagram showing an example of a configuration of a maximum likelihood decoding device according to a first embodiment.

FIG. 2 shows a configuration of the PRML decoder 6 and the signal evaluator 7 shown in FIG. 1.

Incidentally, in practice, the PRML decoder 6 and the signal evaluator 7 are formed integrally on the same board as enclosed by a broken line in FIG. 1. The embodiment supposes that the PRML decoder 6 and the signal evaluator 7 thus formed integrally on the same board form one maximum likelihood decoding device.

The PRML decoder 6 includes: a waveform equalizer (EQ-PR) 21 for equalizing channel response to target response; a branch metric calculating unit (BMC) 22 for calculating a branch metric for each branch from the output of the equalizer 21; a path metric updating unit (ACS) 23 for taking in branch metrics, comparing branches, and selecting a path, and updating a path metric; and a path memory updating unit (PMEM) 24 for updating a path memory according to information on the selected path.

In particular, the present embodiment has an adaptive type reference level generating circuit 25 for generating reference levels according to the level of the reproduced signal RF in order to realize the adaptive type Viterbi detecting operation described above.

The role of the equalizer 21 shown in FIG. 2 is to equalize channel response to target response PR(1, 2, 2, 1) or PR(1, 2, 2, 2, 1). The target response is not necessarily limited to this. For example, in a case of a D2 constraint (a minimum run length d=2 and a shortest mark length of 3T), a target with a longer constraint length is used.

The reproduced signal RF resulting from the equalization process by the equalizer 21 is supplied to the branch metric calculating unit 22 and is also supplied to the adaptive type reference level generating circuit 25.

The branch metric calculating unit 22 calculates a branch metric corresponding to each branch on the basis of the value of the reproduced signal RF from the equalizer 21 and the value of each set reference level (reference level data R-Lva to R-Lvx) from the adaptive type reference level generating circuit 25 described above.

Description of Viterbi detecting operation in the following will be focused on an example with a five-tap constraint length as in PR(1, 2, 2, 2, 1). When there is a D1 constraint (a minimum run length d=1 and a shortest mark length of 2T) as a minimum run-length rule, the PRML decoder 6 having the branch metric calculating unit 22, the path metric updating unit 23, and the path memory updating unit 24 is provided with 10 states each composed of four bits and 16 branches each composed of five bits. These branches make a connection between states in compliance with the D1 constraint.

The 10 states each composed of four bits are states identified by 10 bit strings 0000, 0001, 0011, 0110, 0111, 1000, 1001, 1100, 1110, and 1111 that satisfy the D1 constraint, that is, a constraint requiring zero or one not to appear singly (not to appear singly in two bits in the middle of four bits in a four-bit string, as described above) among 16 bit strings each composed of four bits which strings are 0000, 0001, 0010, 0011, 0100, 0101, 0110, 0111, 1000, 1001, 1010, 1011, 1100, 1101, 1110, and 1111.

The 16 branches each composed of five bits are states identified by 16 bit strings 00000, 00001, 00011, 00110, 00111, 01100, 01110, 01111, 10000, 10001, 10011, 11000, 11001, 11100, 11110, and 11111 that satisfy the D1 constraint, that is, the constraint requiring zero or one not to appear singly (not to appear singly in three bits in the middle of five bits in a five-bit string, as described above) among 32 bit strings each composed of five bits which strings are 00000, 00001, 00010, 00011, 00100, 00101, 00110, 00111, 01000, 01001, 01010, 01011, 01100, 01101, 01110, 01111, 10000, 10001, 10010, 10011, 10100, 10101, 10110, 10111, 11000, 11001, 11010, 11011, 11100, 11101, 11110, and 11111.

Incidentally, when target response is PR(1, 2, 2, 1), six states each composed of three bits and 10 branches each composed of four bits are provided. The branches make a connection between states in compliance with the D1 constraint.

A method of preparing the bit strings of the states and the branches is similar to the method of preparing the bit strings of the states and the branches in PR(1, 2, 2, 2, 1).

The branch metric calculating unit 22 calculates a branch metric for the 16 branches described above, and transfers the result to the path metric updating unit 23.

The path metric updating unit (ACS) 23 updates the path metrics of paths reaching the 10 states, and simultaneously transfers path selection information to the path memory updating unit 24.

The path memory updating unit 24 updates a path memory of the paths reaching the above-mentioned 10 states. Bit sequences stored in the path memory converge into a likely sequence while path selection is repeated. The result is output as binarized signal DD as a result of bit detection by the PRML decoder 6.

The binarized signal DD is supplied to the demodulator 8 shown in FIG. 1, and also supplied to the 1M modulator circuit 25 as well as a maximum likelihood path generating circuit 32 and a second path generating circuit 33 to be described later within the signal evaluator 7 in this case, as shown in FIG. 2.

The path memory updating unit 24 updates the path memory of the paths reaching the above-mentioned 10 states, and thereby obtains information on the bit sequence of a likely path (maximum likelihood path) that ultimately survives and information on the bit sequence of a next likely path (second path).

The path memory updating unit 24 in the first embodiment is provided with an error determining unit 24a shown in FIG. 2 for determining a type of error of the bit sequence of the second path with respect to the bit sequence of the maximum likelihood path using the information on these bit sequences.

Incidentally, the operation of the error determining unit 24a will be described later.

A result of determination by the error determining unit 24a is supplied as path selection result information SP shown in the figure to an enabler 31 and the second path generating circuit 33 to be described later within the signal evaluator 7.

The adaptive type reference level generating circuit 25 generates reference level data R-Lva to R-Lvx to be set in the branch metric calculating unit 22 on the basis of the reproduced signal RF from the equalizer 21 and the binarized signal DD from the path memory updating unit 24.

Specifically, the adaptive type reference level generating circuit 25 in this case is provided with x low-pass filters disposed according to the number (a to x) of reference levels set in correspondence with an employed PR class. The value of the reproduced signal RF is divided according to the pattern of the binarized signal DD and input to these low-pass filters, whereby the value of the reproduced signal RF is averaged for each reference level. The result is output as reference level data R-Lva to R-Lvx.

Reference level data R-Lv generated by the adaptive type reference level generating circuit 25 will be described with reference to FIGS. 10A and 10B.

Figure 10A:
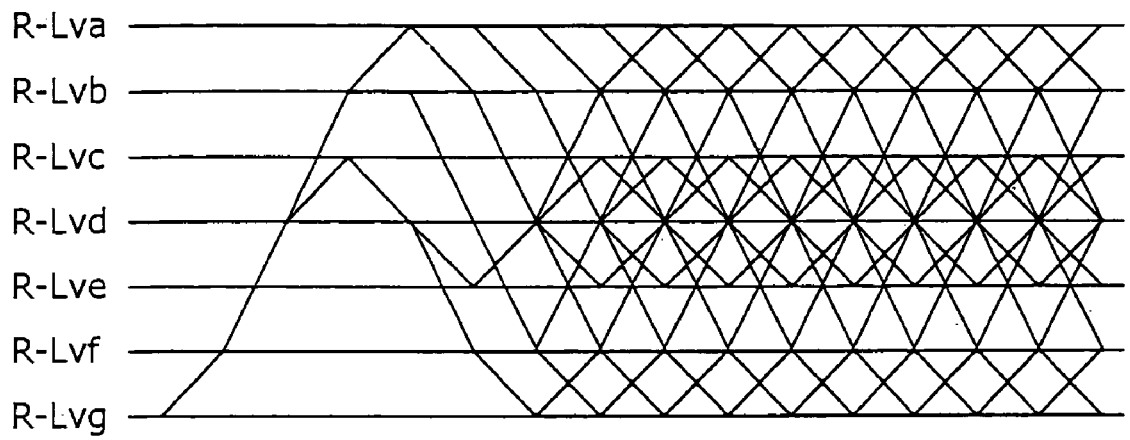
FIGS. 10A and 10B are diagrams showing a relation between reference levels set in a Viterbi detector (PRML detector) and a reproduced signal (eye pattern) when PR(1, 2, 2, 1) is employed.
Figure 10B:
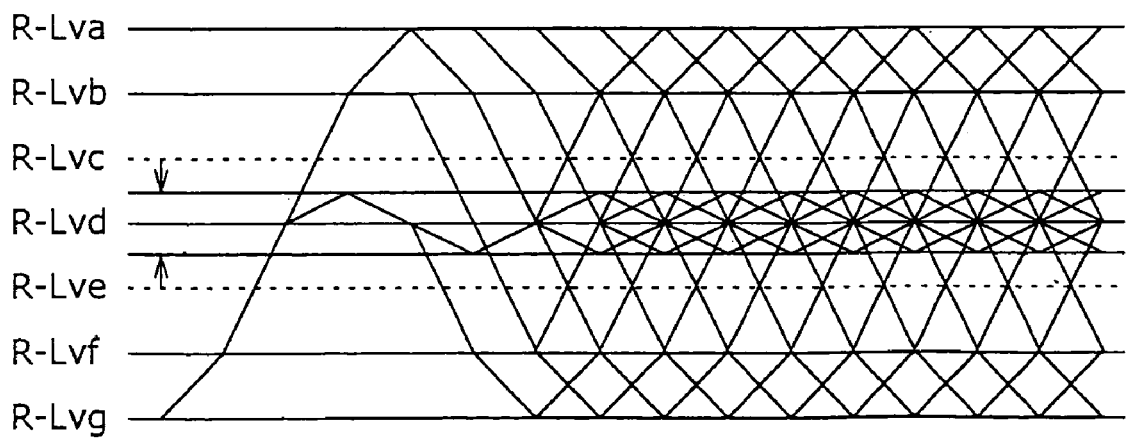

FIGS. 10A and 10B show a relation between reference levels and the reproduced signal RF (eye pattern) when PR(1, 2, 2, 1), for example, is employed as a partial response type.

When PR(1, 2, 2, 1) is employed, seven values R-Lva to R-Lvg shown in FIGS. 10A and 10B are set as reference level data R-Lv.

FIG. 10A shows a case where the amplitude levels in the reproduced signal RF of mark lengths corresponding to the respective reference levels of the reference level data R-Lva to R-Lvg are normally distributed and an ideal reproduced signal waveform expected in the PR type is obtained.

On the other hand, FIG. 10B shows a case where the reproduced signal of a shortest mark length, in particular, cannot obtain a sufficient amplitude as, for example, the recording density of the recording medium is increased.

In such a case, each reference level (the reference level R-Lvc and the reference level R-Lve represented by broken lines in FIG. 10B) set in correspondence with the shortest mark length becomes a shifted value with respect to actual signal amplitude distribution. Thus, a reproduced signal waveform different from an ideal waveform expected in the PR is obtained, and correspondingly the reference levels are shifted. An error, therefore, occurs in a branch metric calculated on the basis of the values of the reference levels. Thereby an error may also be caused in the binarized signal DD obtained by the PRML decoder 6.

The adaptive type reference level generating circuit 25 provided in the present embodiment divides the reproduced signal RF for each of the reference levels (R-Lva to R-Lvx), calculates an average value for each reference level, and obtains the average values as reference level data R-Lva to R-Lvx to be actually set, as described above. That is, such an operation changes each of the reference levels R-Lvc and R-Lve in the example of FIG. 10B, for example, to a level represented by a solid line according to the waveform of the actual reproduced signal RF, that is, an average value of distribution of a corresponding waveform component. Thereby the reference levels adapted to the actual reproduced signal RF can be set.

Since the reference level data R-Lv adapted to the actual reproduced signal RF is thus obtained, even when an ideal reproduced signal RF expected in the PR class is not obtained, a proper value can be obtained as a branch metric calculated in the branch metric calculating unit 22. It is thereby possible to improve the reliability of the binarized signal DD.

Incidentally, while a case where the amplitude of the shortest mark is decreased is illustrated in FIG. 10B, there is a case where the ideal reproduced signal RF is not obtained because of asymmetry, for example. Even in such a case, the above-described adaptive type reference level generating circuit 25 operates to change the values of the reference level data R-Lv according to the actual reproduced signal RF such that the values of the reference level data R-Lv follow the actual reproduced signal RF and set the reference levels according to each distribution of the reproduced signal RF. That is, it is possible to improve the reliability of the binarized signal DD by dealing with such asymmetry.

Incidentally, a constitution for realizing such an adaptive type Viterbi detection method is also described in Japanese Patent No. 3033238, for example.

The reference level data R-Lva to R-Lvx generated in the adaptive type reference level generating circuit 25 is supplied to the branch metric calculating unit 22.

In the present embodiment, in particular, the reference level data R-Lva to R-Lvx is also supplied to the maximum likelihood path generating circuit 32 and the second path generating circuit 33 within the signal evaluator 7.

In obtaining a signal evaluation index indicating the accuracy of detection of the binarized signal DD in the PRML decoder 6 configured as described above, TI jitter as fluctuation in the direction of a time base does not necessarily have a correlation with a bit error rate in bit detection using PRML, as described above, and it is, therefore, necessary to obtain another index for evaluating signal quality.

A method of bit detection by PRML is an algorithm that compares the magnitudes of a Euclidean distance between a partial response sequence obtained from a correct bit sequence and the reproduced signal RF (that is, a path metric for the correct bit sequence) and a Euclidean distance between a partial response sequence obtained from an erroneous bit sequence and the reproduced signal RF (that is, a path metric for the erroneous bit sequence), retains a closer path, that is, a path with a smaller path metric as a more likely path, and provides a path ultimately surviving after repetition of this operation (maximum likelihood path) as a result of detection.

According to such an algorithm, a large difference between the path metrics of the two closest paths (suppose that the two closest paths are a maximum likelihood path Pa and a second path Pb) with smallest path metric values as candidates selected for the ultimately surviving path indicates that the surviving path is more likely, whereas a small difference between the path metrics of the two closest paths indicates that the surviving path is more unlikely, that is, there is a stronger possibility of an detection error. This will be described with reference to FIGS. 6A and 6B.

Figure 6A:
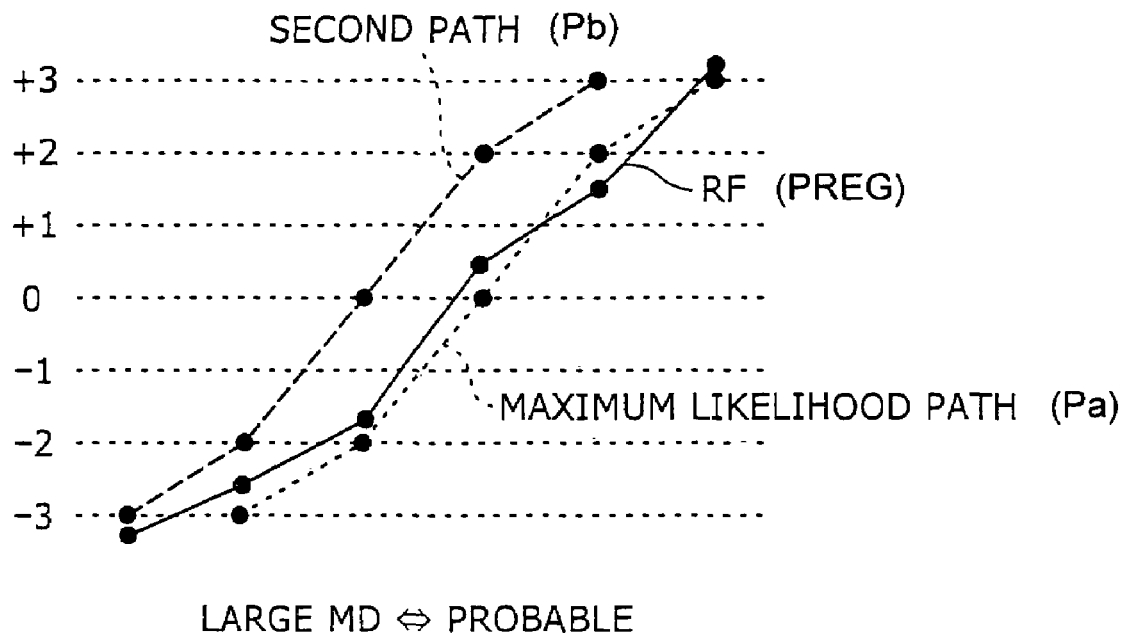
FIGS. 6A and 6B are diagrams of assistance in explaining a relation between a maximum likelihood path, a second path, and a reproduced signal.
Figure 6B:
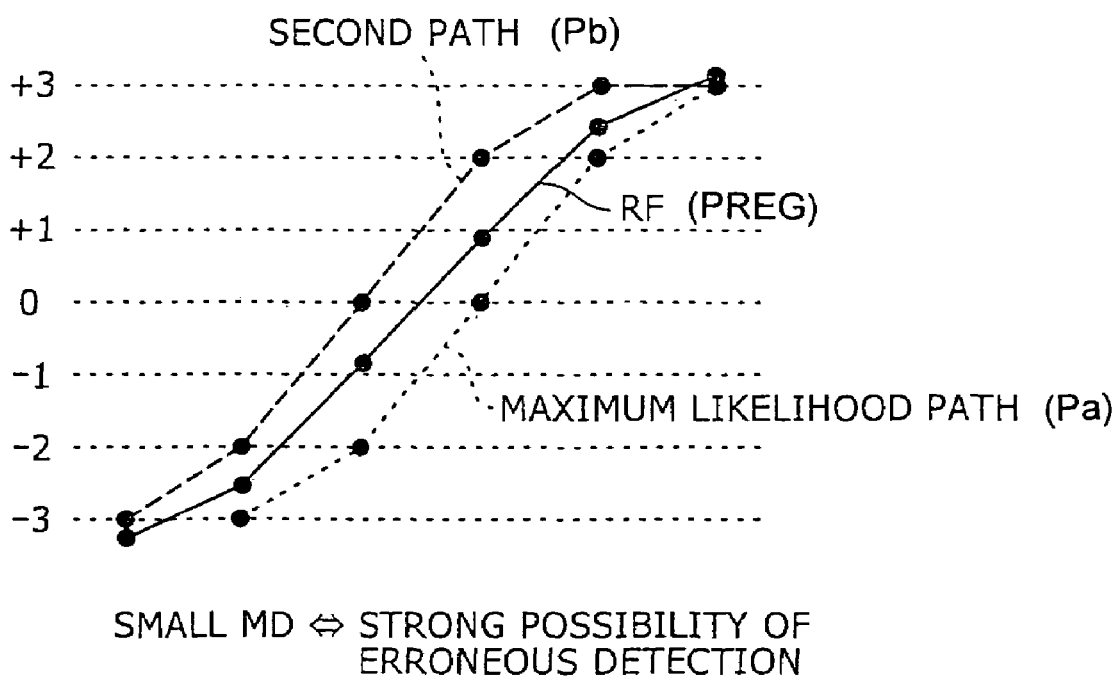

FIGS. 6A and 6B are diagrams showing relation between the maximum likelihood path Pa, the second path Pb, and the actual reproduced signal RF (PREQ). Values "+3, +2, +1, 0, −1, −2, −3" on an axis of ordinates in the figures represent values of reference levels assumed in PR(1, 2, 2, 1).

The maximum likelihood path Pa and the second path Pb shown in the figures can be considered to be the two paths for final comparison with the reproduced signal RF. That is, a path metric value for the maximum likelihood path Pa and a path metric value for the second path Pb are compared with each other, and a path with a smaller path metric value is selected as a survivor path.

Incidentally, for confirmation, a path metric is a sum of Euclidean distances, that is, a sum of branch metrics between sampling values of the reproduced signal RF which values are obtained in respective sampling timings indicated by black dots in FIGS. 6A and 6B and respective values obtained in corresponding timings in the maximum likelihood path Pa (or the second path Pb).

A comparison between FIG. 6A and FIG. 6B indicates that in the case of FIG. 6A, the Euclidean distance between the maximum likelihood path Pa and the reproduced signal RF is sufficiently close, whereas the Euclidean distance between the second path Pb and the reproduced signal RF is sufficiently far. That is, the path metric value for the maximum likelihood path Pa is sufficiently small and the path metric value for the second path Pb is sufficiently large. It can thereby be determined that the maximum likelihood path Pa as a detection path in this case is a more likely path.

On the other hand, in FIG. 6B, the Euclidean distance between the maximum likelihood path Pa and the reproduced signal RF is increased as compared with FIG. 6A, and the Euclidean distance between the second path Pb and the reproduced signal RF is closer. That is, in this case, the path metric value for the maximum likelihood path Pa is larger than in FIG. 6A, whereas the path metric value for the second path Pb is smaller than in FIG. 6A. Therefore the likelihood of the maximum likelihood path Pa as detection path in this case is decreased. In this case, the likelihood of the second path Pb as the other path is increased, and thus the possibility of the second path Pb being the maximum likelihood path is increased. Hence, there is a higher possibility that the detection path as the maximum likelihood path Pa is erroneously detected in place of the path as the second path Pb.

Thus, when the path metric value for the maximum likelihood path Pa is sufficiently smaller than the path metric value for the second path Pb, it can be determined that it is more likely that bit detection is performed. On the other hand, as the path metric value for the maximum likelihood path Pa becomes larger and the path metric value for the second path Pb becomes smaller, it can be determined that there is a higher possibility of the detection path as the maximum likelihood path Pa being the wrong path.

Detection accuracy when the PRML method is employed can be estimated by a difference between the path metric value for the maximum likelihood path Pa and the path metric value for the second path Pb, that is, a metric difference.

In the present embodiment, such a metric difference (denoted as MD) is obtained as follows.

[Equation 1]
$$MD = \sum_i (PB_i - R_i)^2 - \sum_i (PA_i - R_i)^2$$

where $PB_i$, $PA_i$, and $R_i$ represent the respective values of the second path Pb, the maximum likelihood path Pa, and the reproduced signal RF in same sampling timing.

That is, the metric difference MD in this case is a value obtained by subtracting the path metric value for the maximum likelihood path Pa from the path metric value for the second path Pb.

The metric difference MD has a maximum value when the path metric value for the maximum likelihood path Pa in the right member of the above equation is zero, that is, when the maximum likelihood path Pa and the reproduced signal RF exactly coincide with each other. That is, this metric difference MD is information indicating that the larger the value of the metric difference MD, the higher the detection accuracy (that is, the better the signal quality).

FIGS. 6A and 6B, described above, indicate that when the maximum likelihood path Pa and the reproduced signal RF exactly coincide with each other, as described above, the path metric for the second path Pb is a Euclidean distance between the maximum likelihood path Pa and the second path Pb. Hence, the maximum value of the metric difference MD as described above is the value of the Euclidean distance between the maximum likelihood path Pa and the second path Pb.

A minimum value of the metric difference MD is zero when the path metric value for the maximum likelihood path Pa and the path metric value for the second path Pb are a same value. That is, the minimum value of the metric difference MD is obtained when the reproduced signal RF is situated at an exact middle position between the maximum likelihood path Pa and the second path Pb in the case of FIGS. 6A and 6B.

Thus, the metric difference MD is information indicating higher detection accuracy as the metric difference MD becomes closer to the value of the Euclidean distance between the maximum likelihood path Pa and the second path Pb (maximum value), and conversely indicating lower detection accuracy and a higher possibility of an error as the metric difference MD becomes closer to zero (minimum value).

It is thus possible to estimate a rate of occurrence of errors in the PRML decoder 6 on the basis of the metric difference MD obtained by the above equation. Then, statistical information based on, for example, a variance value of the value of the metric difference MD is obtained, and the statistical information can be used as an index indicating an error occurrence rate.

However, such statistical information itself based on the metric difference MD simply indicates only a rate of nearness or farness of the Euclidean distance between the reproduced signal RF and the maximum likelihood path Pa. Therefore, this information is not used singly as a signal quality evaluation value. In practice, the statistical information (for example, a variance value) on the metric difference MD is normalized using the Euclidean distance between the maximum likelihood path Pa and the second path Pb when the metric difference MD is actually obtained.

That is, by performing such a normalization, it is possible to obtain information indicating how close the reproduced signal RF is to the maximum likelihood path Pa with the Euclidean distance between the maximum likelihood path Pa and the second path Pb as a unit, and thereby obtain information specifically indicating how high the detection accuracy is.

Consideration will be given in the following to the Euclidean distance between the maximum likelihood path Pa and the second path Pb, the Euclidean distance between the maximum likelihood path Pa and the second path Pb being used in normalizing the variance value of the metric difference MD.

As is understood from the description so far, the second path Pb has a next-smallest path metric value to that of the maximum likelihood path Pa.

When consideration is given to the maximum likelihood path (detection path) Pa and the second path Pb on the basis of a comparison between bit sequences obtained on the basis of the respective paths, it is known that the bit sequence based on the second path Pb ideally has an error of only one bit with respect to the detected bit sequence at all times in PRML with a target response PR(1, 2, 2, 1), for example.

Referring to FIG. 9, description will be made below of a relation between a type of error of the bit sequence of the second path Pb with respect to the bit sequence of the maximum likelihood path Pa and the Euclidean distance between the maximum likelihood path Pa and the second path Pb in that case when consideration is given to the maximum likelihood path (detection path) Pa and the second path Pb on the basis of a comparison between the bit sequences obtained on the basis of the respective paths.

FIG. 9 shows a result of a calculation of Euclidean distances to the partial response sequences of bit sequences with a one-bit error and a two-bit error, for PR(1, 1), PR(1, 2, 1), PR(1, 2, 2, 1), and PR(1, 2, 2, 2, 1).

Incidentally, of two-bit errors, two-bit errors including two or more errors within a constraint length are considered important. Particularly important among such cases are an error caused by a disappearance or an appearance of a mark with a mark length of two (2T mark) and an error caused by a shift of a 2T mark. Thus, FIG. 9 shows three types of errors, that is, a one-bit error, a two-bit error caused by a disappearance or an appearance of a shortest mark, and a two-bit error caused by a shift of a shortest mark.

A string written as "000011000" or the like in FIG. 9 is obtained as a difference between an erroneous bit sequence and a correct bit sequence.

Specifically, a difference "00001000" of a one-bit error is a difference between an erroneous bit sequence "111110000" and a correct bit sequence "111100000", for example. That is, the difference represents an error caused by an edge shift in a signal waveform.

A difference "00011000" shown as a two-bit error is a difference between an erroneous bit sequence "1000000011" and a correct bit sequence "000110011" (or an erroneous bit sequence "000110011" and a correct bit sequence "000000011"), for example. That is, the difference represents an error caused by disappearance or appearance of a 2T mark.

A difference "00010-1000" shown as a two-bit error is a difference between an erroneous bit sequence "0000110000"

and a correct bit sequence "0001100000", for example. That is, the difference represents an error caused by a shift of a 2T mark.

FIG. 9 indicates that in PR(1, 2, 2, 1), an error type corresponding to a minimum Euclidean distance is the one-bit error with a Euclidean distance of 10. A minimum Euclidean distance between two partial response sequences (that is, paths) means that a relation between these two paths is a relation between the maximum likelihood path Pa and the second path Pb. Hence, since the Euclidean distance between the respective partial response sequences based on two bit sequences in a relation with a one-bit error is a minimum, it can be assumed that a relation between the respective bit sequences, based on the maximum likelihood path Pa and the second path Pb, is always such a relation with a one-bit error.

However, in PR(1, 2, 2, 1), the value of the Euclidean distance in the case of a two-bit error "00010-1000" (a shift of a shortest mark) with a next smallest value of Euclidean distance to that of the one-bit error is 12, which is close to the value of the Euclidean distance in the case of the one-bit error.

Since the Euclidean distances of the two error types are thus close to each other, in PR(1, 2, 2, 1), while the one-bit error is dominant because of the minimum Euclidean distance, as described above, such a two-bit error caused by a shift of a shortest mark can be a type of error between the bit sequences of the maximum likelihood path Pa and the second path Pb, depending on the level of noise caused in the actual reproduced signal RF, for example.

Incidentally, as for other PR types, error types corresponding to a minimum Euclidean distance in PR(1, 1) and PR(1, 2, 1) are the same one-bit single error. In PR(1, 2, 2, 2, 1), on the other hand, the Euclidean distance of the two-bit error caused by a shift of a shortest mark is a minimum of 12. That is, the Euclidean distance of the two-bit error is smaller than a Euclidean distance of 14 in the case of the one-bit single error.

FIG. 7A and FIG. 7B illustratively show a relation between the maximum likelihood path Pa and the second path Pb in the case of a one-bit error that is dominant as an error between the bit sequences of the maximum likelihood path Pa and the second path Pb and a relation between the maximum likelihood path Pa and the second path Pb in the case of a two-bit error caused by a shift of a shortest mark, which error can also be an error between the bit sequences of the maximum likelihood path Pa and the second path Pb when PR(1, 2, 2, 1) is employed.

FIG. 7A specifically shows the case of a one-bit error in a bit sequence "0000001111" of the second path Pb with respect to a bit sequence "0000011111" of the maximum likelihood path Pa. FIG. 7B illustrates the case of a two-bit error caused by a shift of a shortest mark in a bit sequence "0000011000" of the second path Pb with respect to a bit sequence "0000110000" of the maximum likelihood path Pa.

Incidentally, in these figures, a solid line represents the maximum likelihood path Pa, and a broken line represents the second path Pb. In the figures, suppose that 3, 2, 1, 0, −1, −2, and −3 are set as reference levels, as shown in the figures, and that, therefore, ideal reference levels assumed in PR(1, 2, 2, 1) are set.

In the case of the one-bit error in FIG. 7A, the maximum likelihood path Pa traces values of −3, −2, 0, 2, and 3 in respective sampling timings, as shown in the figure. On the other hand, the second path Pb traces values of −3, −3, −2, 0, and 2.

A Euclidean distance $d^2$ between the two paths can be calculated by obtaining the squares of differences between the values thus traced by the paths and then obtaining a sum of the squares of the differences. That is, in this case, letting $PA_i$ and $PB_i$ be values in the maximum likelihood path Pa and the second path Pb, respectively, in the same sampling timing, the Euclidean distance $d^2$ between the two paths can be expressed by $$d^2 = \sum_i (PA_i - PB_i)^2 \qquad \text{[Equation 2]}$$

Hence, the Euclidean distance $d^2$ between the two paths in this case is 10 from $d^2 = 1^2 + 2^2 + 2^2 + 1^2$ as shown in FIG. 7A. This also indicates that the Euclidean distance in the case of the one-bit error is 10, as shown in FIG. 9 described earlier.

In the case of the two-bit error in FIG. 7B, the maximum likelihood path Pa traces values of −3, −3, −2, 0, 1, 0, −2, −3, −3, and −3. On the other hand, the second path Pb traces values of −3, −3, −3, −2, 0, 1, 0, −2, −3, and −3. Hence, the Euclidean distance $d^2$ between the two paths in this case is 12 from $d^2 = 1^2 + 2^2 + 1^2 + (-1)^2 + (-2)^2 + (1)^2$.

That is, the Euclidean distance $d^2$ between the two paths in this case is the Euclidean distance of 12 in the case of the two-bit error caused by a shift of a shortest mark as shown in FIG. 9 described earlier.

From the description so far with reference to FIG. 9 and FIGS. 7A and 7B, when PR(1, 2, 2, 1) is employed, for example, the Euclidean distance $d^2$ between the maximum likelihood path Pa and the second path Pb is 10 in most cases because the one-bit error is dominant as the type of error between the bit sequences of the maximum likelihood path Pa and the second path Pb. Alternatively, depending on the level of noise caused in the actual reproduced signal RF, for example, the type of error between the bit sequences of the maximum likelihood path Pa and the second path Pb can be the two-bit error caused by a shift of a shortest mark, and thus the Euclidean distance between the maximum likelihood path Pa and the second path Pb can be 12.

In either case, the Euclidean distance between the maximum likelihood path Pa and the second path Pb is thus a fixed value according to the type of error between the bit sequences of the maximum likelihood path Pa and the second path Pb. It can, therefore, be assumed that as the value of the Euclidean distance between the maximum likelihood path Pa and the second path Pb, which distance is to be used for normalization in generating an evaluation value based on the metric difference MD, as described earlier, the fixed value of 10 or 12 may be used according to the type of error between the maximum likelihood path Pa and the second path Pb.

Incidentally, the above description states that the Euclidean distance between the maximum likelihood path Pa and the second path Pb in this case can be 12 in addition to 10. Thus, in this respect, there is a fear of normalization being performed by the Euclidean distance $d^2$ that does not correspond to the variance value of the calculated metric difference MD. In the present embodiment, however, the Euclidean distance $d^2$ and the metric difference MD are calculated with only one error type as a target, as will be described later. Thus, there is no fear of decreasing the reliability of the evaluation value in this respect.

However, since the PRML decoder 6 in the present embodiment is provided with the adaptive type reference level generating circuit 25 shown in FIG. 2, the values of the reference levels (reference level data R-Lv) are changed according to the level of the reproduced signal RF, as described earlier.

Since the values of the reference levels are thus changed, the Euclidean distance between the maximum likelihood path Pa and the second path Pb may also be changed.

This will be described with reference to FIGS. 7A and 7B and FIGS. 8A and 8B.

The above description with reference to FIGS. 7A and 7B has been made supposing that the values of the reference levels are set to the values of ideal reference levels assumed in the PR. Specifically, it is supposed in this case that 3, 2, 1, 0, −1, −2, and −3 are set in correspondence with a case of employing PR(1, 2, 2, 1).

On the other hand, FIGS. 8A and 8B show relations between the maximum likelihood path Pa and the second path Pb when the values of the reference levels are changed from the values of the reference levels in FIGS. 7A and 7B in a case where the relations between the bit sequences of the maximum likelihood path Pa and the second path Pb are the same relations with the one-bit error and the two-bit error, as in FIGS. 7A and 7B.

FIGS. 8A and 8B illustrate a case where the amplitude of the shortest mark in the reproduced signal RF is decreased with increase in the recording density of the recording medium, for example, as illustrated in FIG. 10B, and the values of the reference levels "1" and "−1" are changed so as to be adapted thereto and set at 0.6 and −0.6, respectively.

A comparison between the cases of the one-bit error in FIG. 8A and FIG. 7A shows that in the example of FIG. 8A, the maximum likelihood path Pa and the second path Pb when the reference levels are adapted, as shown in FIG. 8A, trace the same values as in FIG. 7A. Therefore, the value of the Euclidean distance between the maximum likelihood path Pa and the second path Pb is not changed.

On the other hand, a comparison between the cases of the two-bit error in FIG. 8B and FIG. 7B shows that since the values of the reference levels are changed, as described above, the maximum likelihood path Pa in this case trace values of −3, −3, −2, 0, 0.6, 0, −2, −3, −3, and −3, the value in a fifth sampling timing being changed. In addition, the second path Pb trace values of −3, −3, −3, −2, 0, 0.6, 0, −2, −3, and −3, the value in a sixth sampling timing being changed.

Accordingly, the Euclidean distances between the maximum likelihood path Pa and the second path Pb in the fifth and sixth sampling timings, which distances are $1^2$ and $1^2$ in FIG. 7B, are changed to $0.6^2$ and $−0.6^2$ in FIG. 8B. As a result, the Euclidean distance $d^2$, which is 12 in FIG. 7B, is changed to 10.72 from $d^2=1^2+2^2+0.6^2+(−0.6^2)+(−2^2)+(−1^2)$ in FIG. 8B.

Thus, adaptively varying the reference levels may result in a change in the Euclidean distance $d^2$ between the maximum likelihood path Pa and the second path Pb.

Incidentally, since the examples of FIGS. 8A and 8B illustrate a case where reference levels are changed so as to correspond to only a decrease in the amplitude level of the smallest mark, the Euclidean distance $d^2$ is not changed in the case of the one-bit error (the case of FIG. 8A).

However, in some cases, ideal amplitudes are not obtained in the actual reproduced signal RF due to, for example, effects of asymmetry, as described earlier, and accordingly the values of other reference levels may be changed adaptively, for example. That is, the Euclidean distance $d^2$ can be changed also in the case of the one-bit error depending on the way in which the values of such reference levels are changed.

Thus, the Euclidean distance $d^2$ between the maximum likelihood path Pa and the second path Pb can be changed. Therefore, when normalization using a fixed Euclidean distance $d^2$ as in a convention method is performed in the case where the configuration of an adaptive type Viterbi detector as in the present embodiment is employed, normalization is performed using the Euclidean distance of 12 based on the settings of the ideal reference levels in place of the Euclidean distance $d^2$ that should properly be 10.72 in the example of FIG. 8B, for example. It is, therefore, impossible to obtain an accurate evaluation value.

That is, since an erroneous value is thus used as the information of the Euclidean distance $d^2$ between the maximum likelihood path Pa and the second path Pb which distance is to be used for normalization, there is a fear of correspondingly decreasing the reliability of the evaluation value using the metric difference MD.

Accordingly, the present embodiment provides a more reliable evaluation value by actually calculating the value of the Euclidean distance $d^2$, which is to be changed when the values of the reference levels are variably set.

The internal configuration of the signal evaluator 7 implementing such an operation in the present embodiment is shown in FIG. 2.

The signal evaluator 7 in FIG. 2 includes an enabler 31, a maximum likelihood path generating circuit 32, a second path generating circuit 33, a delay compensating circuit 34, a Euclidean distance calculating circuit 35, a sample average value calculating circuit 36, a metric difference calculating circuit 37, a variance value calculating circuit 38, and an evaluation value normalizing circuit 39.

As described thus far, the present embodiment has as a main problem the fact that the values of reference levels can be changed from ideal values because the adaptive type Viterbi detection method is employed, and that the value of the Euclidean distance $d^2$ between the maximum likelihood path Pa and the second path Pb is correspondingly changed.

In practice, however, another problem is presented in addition to such a problem in that there is no guarantee that a single error type can necessarily be identified as the type of error between the maximum likelihood path Pa and the second path Pb, as described earlier with reference to FIG. 9.

Specifically, as shown in FIG. 9, in PR(1, 2, 2, 1), for example, while the one-bit error is dominant as the type of error between the maximum likelihood path Pa and the second path Pb because the Euclidean distance=10 is a minimum, the two-bit error caused by a shift of a shortest mark with the next smallest Euclidean distance can actually be a type of error between the maximum likelihood path Pa and the second path Pb, depending on the level of noise caused in the actual reproduced signal RF, because the Euclidean distance of the two-bit error is 12, which is close to the Euclidean distance of the one-bit error.

Alternatively, when PR(1, 2, 2, 2, 1) is employed, from FIG. 9, the two-bit error, caused by a shift of a shortest mark with the Euclidean distance=12, is dominant as an error relation between the maximum likelihood path Pa and the second path Pb. However, a type of error corresponding to the next smallest Euclidean distance is the one-bit error with the Euclidean distance=14. Therefore, also in this case, both error types can be the type of error between the maximum likelihood path Pa and the second path Pb because the Euclidean distances in the cases of the respective error types are close to each other.

As shown in these examples, it cannot be said definitely that a certain type is always obtained as a type of error between the bit sequences of the maximum likelihood path Pa and the second path Pb.

That is, in such a case, when the Euclidean distance between the maximum likelihood path Pa and the second path Pb is always calculated, the Euclidean distance $d^2$ between the maximum likelihood path Pa and the second path Pb with different types of errors is calculated in a mixed manner.

Therefore, a problem of a decrease in the reliability of the evaluation value is presented in that normalization based on the thus calculated Euclidean distance $d^2$ is performed.

Accordingly, the present embodiment operates to calculate the Euclidean distance $d^2$ between the maximum likelihood path Pa and the second path Pb and the metric difference MD only when the type of error of the bit sequence of the second path Pb with respect to the bit sequence of the maximum likelihood path Pa is a predetermined error type as a target.

Specifically, in the case of PR(1, 2, 2, 1), for example, parts in the signal evaluator 7 perform calculating operation only when the type of error between the maximum likelihood path Pa and the second path Pb is a one-bit error or only when the type of error between the maximum likelihood path Pa and the second path Pb is a two-bit error caused by a shift of a shortest mark, for example.

The present embodiment is provided with the error determining unit 24a disposed within the path memory updating unit 24 within the PRML decoder 6 described earlier and the enabler 31 within the signal evaluator 7 as a constitution for determining the type of error between the maximum likelihood path Pa and the second path Pb and performing control based on a result of the determination.

First, the error determining unit 24a within the path memory updating unit 24 determines whether the type of error of the bit sequence of the second path Pb with respect to the bit sequence of the maximum likelihood path Pa is a predetermined error type as a target.

That is, the first embodiment is configured to determine whether the type of error between the maximum likelihood path Pa and the second path Pb is a predetermined error type as a target by actually checking the type of error of the second path Pb with respect to the maximum likelihood path Pa.

As described earlier, the path memory updating unit 24 obtains therewithin the information of the bit sequences of the maximum likelihood path Pa and the second path Pb. The error determining unit 24a, which is disposed within the path memory updating unit 24, can determine whether the type of error of the bit sequence of the second path Pb with respect to the bit sequence of the maximum likelihood path Pa is a predetermined error type by comparing the bit sequence of the maximum likelihood path Pa with the bit sequence of the second path Pb.

The following method, for example, can be employed for such determining operation.

For example, in the case of the two-bit error caused by the shift of the shortest mark when PR(1, 2, 2, 2, 1) is employed, fifth bits and seventh bits in the bit sequences of the two paths, that is, the maximum likelihood path Pa and the second path Pb are different from each other, and at least first to eleventh bits other than the fifth bits and the seventh bits in the bit sequences of the two paths coincide with each other. Thus, bit positions at which the bits coincide with each other or do not coincide with each other can be identified according to the error type. It is accordingly possible to determine whether the type of error of the bit sequence of the second path Pb with respect to the bit sequence of the maximum likelihood path Pa is a predetermined error type as a target on the basis of a result of determination of whether the values at the thus identified bit positions coincide with each other or do not coincide with each other according to the predetermined error type as a target.

The error determining unit 24a supplies a result of such a determining operation as error determination result information JS shown in the figure to the enabler 31.

In this case, the error determination result information JS is also supplied from a branch point to the second path generating circuit 33, which will be described later.

Incidentally, a constitution for realizing such an operation of the error determining unit 24a has already been proposed by the present applicant.

The enabler 31 is provided to actually control the performance/non-performance of the calculating operation of parts in the signal evaluator 7 on the basis of the error determination result information JS supplied from the error determining unit 24a.

The enabler 31 outputs a signal enable shown in FIG. 2 when the error determination result information JS indicates that the type of error of the second path Pb with respect to the maximum likelihood path Pa is judged to be an error type as a target.

Though not shown in the figure, this signal enable is supplied to parts within the signal evaluator 7 (the maximum likelihood path generating circuit 32, the second path generating circuit 33, the Euclidean distance calculating circuit 35, the sample average value calculating circuit 36, the metric difference calculating circuit 37, and the variance value calculating circuit 38). That is, with such a constitution, these parts are activated by the signal enable only when the type of error of the second path Pb with respect to the maximum likelihood path Pa is judged to be an error type as a target. Consequently, the operation for calculating the evaluation value is not performed when an error type other than the error type as the target is obtained as the type of error of the second path Pb with respect to the maximum likelihood path Pa. In other words, it is possible to prevent the Euclidean distance $d^2$ and the metric difference MD for the maximum likelihood path Pa and the second path Pb with a type of error other than the error type as the target from being reflected in the evaluation value, and thus effectively prevent a decrease in the reliability of the evaluation value.

Incidentally, from the above description, it is possible to prevent a decrease in the reliability of the evaluation value in this case when the values of the Euclidean distance $d^2$ and the metric difference MD calculated with the maximum likelihood path Pa and the second path Pb with a different type of error being mixed are not reflected in the evaluation value. Hence, based on this consideration, it suffices to supply the signal enable to at least the sample average value calculating circuit 36 and the variance value calculating circuit 38.

The maximum likelihood path generating circuit 32 and the second path generating circuit 33 in FIG. 2 are provided to generate the maximum likelihood path Pa and the second path Pb.

The maximum likelihood path generating circuit 32 generates the maximum likelihood path Pa on the basis of the reference level data R-Lva to R-Lvx from the adaptive type reference level generating circuit 25 within the PRML decoder 6 and the binarized signal DD.

The binarized signal DD is the information of a bit sequence detected as a most likely bit sequence by the PRML decoder 6. That is, the maximum likelihood path generating circuit 32 reproduces a partial response sequence (that is, the maximum likelihood path Pa) from the information of the bit sequence thus detected as the most likely bit sequence.

PRML supposes an occurrence of intersymbol interference in the reproduced signal RF. Hence, in reproducing the path from the information of the bit sequence, it suffices to reproduce an intersymbol interference supposed in the PR class. Specifically, in PR(1, 2, 2, 1), for example, it suffices to perform a convolution operation on the input bit sequence using coefficients (1, 2, 2, 1).

In the present embodiment, however, since the adaptive type Viterbi detection method is employed, the values of the reference levels are not set at ideal values assumed in the PR. Thus, a correct path cannot be reproduced unless the convolution coefficients are changed accordingly.

Hence, when the convolution coefficients are changed according to the actually set reference level data R-Lva to R-Lvx, a correct path can be reproduced by the convolution coefficients corresponding to the values of the actually set reference levels even in a case where the values of the reference levels are changed by the adaptive type method.

First, the maximum likelihood path generating circuit 32 is supplied with the values of the reference level data R-Lva to R-Lvx corresponding to each branch within the PRML decoder 6. Next, the maximum likelihood path generating circuit 32 checks the binarized signal DD as another piece of input data to determine a branch corresponding to the bit string. Finally, the maximum likelihood path generating circuit 32 selects and outputs one of the reference levels R-Lva to R-Lvx which level corresponds to the determined branch. The maximum likelihood path generating circuit 32 performs this operation at each time, and thereby restores the maximum likelihood path Pa in adaptive type PRML which path corresponds to the binarized signal DD. The information of the maximum likelihood path Pa generated by the maximum likelihood path generating circuit 32 is supplied to the Euclidean distance calculating circuit 35 and the metric difference calculating circuit 37.

Meanwhile, the second path generating circuit 33 is supplied with the reference level data R-Lva to R-Lvx and the binarized signal DD as with the maximum likelihood path generating circuit 32, and also supplied with the error determination result information JS from the error determining unit 24a.

The error determination result information JS indicates whether the type of error of the bit sequence of the second path Pb with respect to the bit sequence of the maximum likelihood path Pa is a predetermined type as a target.

As described above, when the error type can be identified, it is possible to determine whether values at predetermined bit positions in the two bit sequences of the maximum likelihood path Pa and the second path Pb coincide with each other or do not coincide with each other (that is, whether the values at the predetermined bit positions in the two bit sequences of the maximum likelihood path Pa and the second path Pb are in inverted relation or in non-inverted relation).

Thus, when the type of error of the bit sequence of the second path Pb with respect to the bit sequence of the maximum likelihood path Pa is a predetermined error type as a target, a bit sequence corresponding to the second path Pb can be generated by inverting values at bit positions in the detected bit sequence which positions are identified according to the error type.

In this case, since the binarized signal DD is the detected bit sequence, the second path generating circuit 33 operates, when the error determination result information JS shows a positive result, to invert the values at the predetermined bit positions in the input bit sequence as the binarized signal DD, which positions are set in advance according to the error type as a target. Thereby the information of the bit sequence corresponding to the second path Pb can be obtained.

Also in this case, as with the maximum likelihood path generating circuit 32 described earlier, the second path generating circuit 33 performs at each time the operation of checking the thus obtained bit sequence, determining a branch corresponding to the bit string, and selecting and outputting one of the reference levels R-Lva to R-Lvx which level corresponds to the determined branch. The second path generating circuit 33 thereby generates the second path Pb.

The information of the second path Pb generated by the second path generating circuit 33 is supplied to the Euclidean distance calculating circuit 35 and the metric difference calculating circuit 37.

The Euclidean distance calculating circuit 35 is supplied with the maximum likelihood path Pa and the second path Pb, and calculates a Euclidean distance $d^2$ between the maximum likelihood path Pa and the second path Pb.

Specifically, letting $PA_i$ and $PB_i$ be values in the maximum likelihood path Pa and the second path Pb, respectively, in the same sampling timing, the Euclidean distance calculating circuit 35 performs the calculation by Equation 2 shown earlier.

The sample average value calculating circuit 36 samples values of the Euclidean distance $d^2$ calculated by the Euclidean distance calculating circuit 35, and calculates an average value $<d^2>$ of these values.

The average value $<d^2>$ of the Euclidean distance $d^2$ is thus obtained because when the adaptive type PRML detection method is employed, the value of the calculated Euclidean distance $d^2$ can be slightly changed even between the maximum likelihood path Pa and the second path Pb with a same type of error.

For the one-bit error type as shown in FIG. 7A, for example, the case where the bit sequence of the second path Pb is "0000001111", with the bit sequence of the maximum likelihood path Pa being "0000011111", is taken as an example. Actually, however, Pa="1111100000" and Pb="1111110000", as patterns obtained by completely inverting these bit sequences, also represent a type of one-bit error.

The maximum likelihood path Pa and the second path Pb, as the completely inverted patterns, are obtained as paths going from the top to the bottom rather than the paths going from the bottom to the top, as shown in FIG. 7A.

Thus, even with the same type of error, the path forms of the maximum likelihood path Pa and the second path Pb in each case are different. Therefore, the value of the Euclidean distance $d^2$ calculated in each case can be different depending on a manner of change in the values of reference levels. That is, when adaptive type PRML is employed, the Euclidean distance between the maximum likelihood path Pa and the second path Pb belonging to a same type of error may not necessarily be a same value. Thus, the sample average value calculating circuit 36 is provided to treat the average value $<d^2>$ of the Euclidean distance $d^2$ as the value of the Euclidean distance $d^2$ between the maximum likelihood path Pa and the second path Pb in the error type as a target.

The metric difference calculating circuit 37 is supplied with the maximum likelihood path Pa and the second path Pb from the maximum likelihood path generating circuit 32 and the second path generating circuit 33, and also supplied with the reproduced signal RF (PREQ) via the delay compensating circuit 34.

In this case, the delay compensating circuit 34 synchronizes the reproduced signal RF with the timing of the maximum likelihood path Pa and the second path Pb, and inputs the reproduced signal RF to the metric difference calculating circuit 37 (X in FIG. 2).

The metric difference calculating circuit 37 calculates the metric difference MD described earlier on the basis of the maximum likelihood path Pa, the second path Pb, and the reproduced signal RF (X). Specifically, letting $PB_i$, $PA_i$, and $R_i$ be the respective values of the second path Pb, the maximum likelihood path Pa, and the reproduced signal RF in same sampling timing, the metric difference calculating circuit 37 performs the calculation by Equation 1 shown earlier.

The variance value calculating circuit 38 calculates the variance value $\sigma^2 MD$ of the metric difference MD supplied from the metric difference calculating circuit 37. The variance value calculating circuit 38 supplies the result to the evaluation value normalizing circuit 39.

The evaluation value normalizing circuit 39 performs a calculation for converting (that is, normalizing) the variance value $\sigma^2 MD$ supplied from the variance value calculating circuit 38 into a value not expressed by a digital representation (bit width or the like) by using the average value $<d^2>$ of the Euclidean distance $d^2$ which average value is supplied from the sample average value calculating circuit 36. The evaluation value normalizing circuit 39 then outputs a result of such normalization as evaluation value EV shown in FIG. 2.

For the normalization performed by the evaluation value normalizing circuit 39, it suffices to perform a calculation by the following equation.

$$EV = \frac{\sqrt{\sigma^2 MD}}{2 \times \langle d^2 \rangle} \quad \text{[Equation 3]}$$

The evaluation value EV thus obtained can be considered to be a result of the division of the variance value $\sigma^2 MD$ of the metric difference MD by the average value $<d^2>$ (actually the square root of the average value $<d^2>$) of the Euclidean distance $d^2$.

Such a normalization can provide an evaluation index whose value becomes larger as signal quality is degraded, with 0% representing best quality, as with a conventional TI jitter index. This normalization method is similar to existing evaluation indexes based on difference metrics which indexes have recently started to be used, and can be regarded as an adaptive type Viterbi-ready version of these indexes.

The variance value $\sigma^2 MD$ in the above equation is handled with a value of ½ for the following reason.

The metric difference MD has, as a maximum value, the value of the Euclidean distance between the maximum likelihood path Pa and the second path Pb, as described above. From the above description with reference to FIGS. 6A and 6B, the reproduced signal RF conceptually moves only in a range as half the distance between the maximum likelihood path Pa and the second path Pb. This is because when the reproduced signal RF exceeds half the Euclidean distance between the maximum likelihood path Pa and the second path Pb, relation between the maximum likelihood path Pa as the detection path and the second path Pb in the figures is reversed.

This indicates that the metric difference MD having the Euclidean distance between the maximum likelihood path Pa and the second path Pb as the maximum value is actually a value that represents the swing range of the reproduced signal RF by twice a number.

Accordingly, in actual normalization, the variance value $\sigma^2 MD$ is handled with a value of ½ so as to deal with the fact that the value of the metric difference MD represents the swing range of the reproduced signal RF by twice a number.

As described above, the signal evaluator 7 in the present embodiment actually calculates the Euclidean distance $d^2$ between the maximum likelihood path Pa and the second path Pb, and normalizes the variance value $\sigma^2 MD$ of the metric difference MD by the average value $<d^2>$ of the Euclidean distance $d^2$.

Since the variance value $\sigma^2 MD$ of the metric difference MD is thus normalized on the basis of the actually calculated Euclidean distance between the maximum likelihood path Pa and the second path Pb, a more appropriate evaluation value EV can be obtained when the values of reference levels are adaptively changed as in the present example.

In addition, in the present embodiment, the error determining unit 24a provided within the PRML decoder 6 and the enabler 31 allow the evaluation value EV to be calculated with only the maximum likelihood path Pa and the second path Pb with a predetermined type of error as a target. That is, in calculating the evaluation value EV, the Euclidean distance $d^2$ and the metric difference MD for the maximum likelihood path Pa and the second path Pb in relations with different types of error is prevented from being mixed. Therefore, a more appropriate evaluation value EV can be obtained also in this respect.

Incidentally, in the present embodiment, the error determining unit 24a and the enabler 31 thus allow the evaluation value EV to be calculated with only a predetermined type of error as a target. However, this does not necessarily mean that the evaluation value EV can be calculated with only one type of error as a target.

That is, by allowing an error type as a target for calculation of the evaluation value EV to be selected alternatively from a plurality of error types, the evaluation value EV can be calculated for each type of error that can occur as a bit error between the maximum likelihood path Pa and the second path Pb.

Specifically, when PR(1, 2, 2, 1) is employed, for example, switching can be performed between the calculation of the evaluation value EV with the one-bit error as a target and the calculation of the evaluation value EV with the two-bit error caused by the shift of the shortest mark as a target.

In this case, the error determining unit 24a within the path memory updating unit 24 is configured to be able to change bit positions at which whether the values of the bits coincide with each other or do not coincide with each other is to be determined in two bit sequences for path comparison according to the type of error set to be a target. That is, since the bit positions, at which the values of the bits are different from each other in the two bit sequences, can be identified according to the type of error, as described above, the error determining unit 24a is configured to be able to determine whether the values at the predetermined bit positions corresponding to the set error type coincide with each other or do not coincide with each other.

Incidentally, also in this case, it suffices for the enabler 31 to output a signal enable according to a result of determination (error determination result information JS) from the error determining unit 24a.

However, with a different type of error, it is of course necessary to generate a path corresponding to the error type as the second path Pb to be generated. Accordingly, for example, the second path generating circuit 33 in this case is configured to be supplied with additional information indicating the set error type. The second path generating circuit 33 is configured to be able to variably set the bit positions at which the values are to be inverted in the binarized signal DD on the basis of the information indicating the error type. Thereby the bit sequence corresponding to the set error type can be generated, and the second path Pb corresponding to the set error type can be generated on the basis of the thus generated bit sequence.

Figure 3:
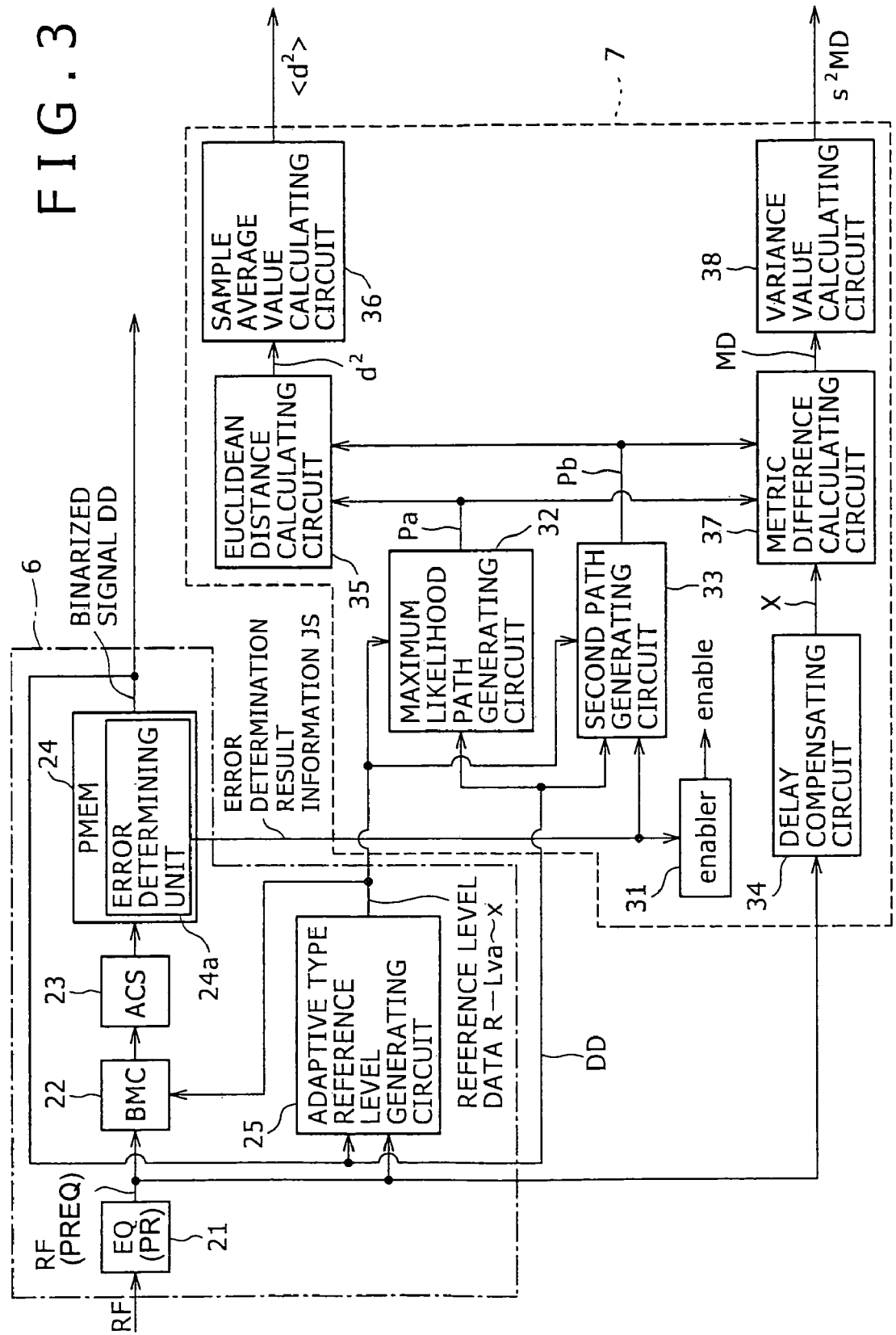
FIG. 3 is a block diagram showing an example of a configuration of a maximum likelihood decoding device according to a second embodiment.

FIG. 3 shows an example of configuration of a second embodiment.

Incidentally, in FIG. 3, the parts already described with reference to FIG. 2 are identified by the same reference numerals, and description thereof will be omitted.

The second embodiment corresponds to a case where the evaluation value EV calculated within the signal evaluator 7 in the foregoing first embodiment is calculated outside the signal evaluator 7.

Specifically, a signal evaluator 7 in this case has a configuration in which the evaluation value normalizing circuit 39 is omitted, and an average value $<d^2>$ and a variance value $\sigma^2 MD$, generated by a sample average value calculating circuit 36 and a variance value calculating circuit 38, respectively, are output as they are to the outside, as shown in FIG. 3.

An evaluation value EV in this case can be calculated by providing the evaluation value normalizing circuit 39 shown in FIG. 2 outside the signal evaluator 7, for example. Even when the evaluation value normalizing circuit 39 is provided on the outside, an increase in calculation delay can be suppressed because the average value $<d^2>$ and the variance value $\sigma^2 MD$ used in calculation of the evaluation value EV in the present embodiment are both a value after averaging operation.

Alternatively, the evaluation value EV in this case can be calculated by software processing by a microcomputer or the like supplied with the average value $<d^2>$ and the variance value $\sigma^2 MD$ outside the signal evaluator 7, for example.

This makes it possible to omit hardware necessary for a normalizing operation. According to the equation for calculating the evaluation value EV as illustrated in the foregoing embodiment, the evaluation value normalizing circuit 39 includes a divider, a multiplier, and a square root calculator and the like, so that area overhead becomes relatively high. Hence, circuit area can be effectively reduced by the omission.

For confirmation, when the configuration of FIG. 3 is employed, the evaluation value EV output from the signal evaluator 7 in the configuration of the reproducing apparatus shown in FIG. 1 is calculated and output outside the signal evaluator 7 in practice. Otherwise the configuration of the reproducing apparatus in this case is the same as shown in FIG. 1.

Figure 4:
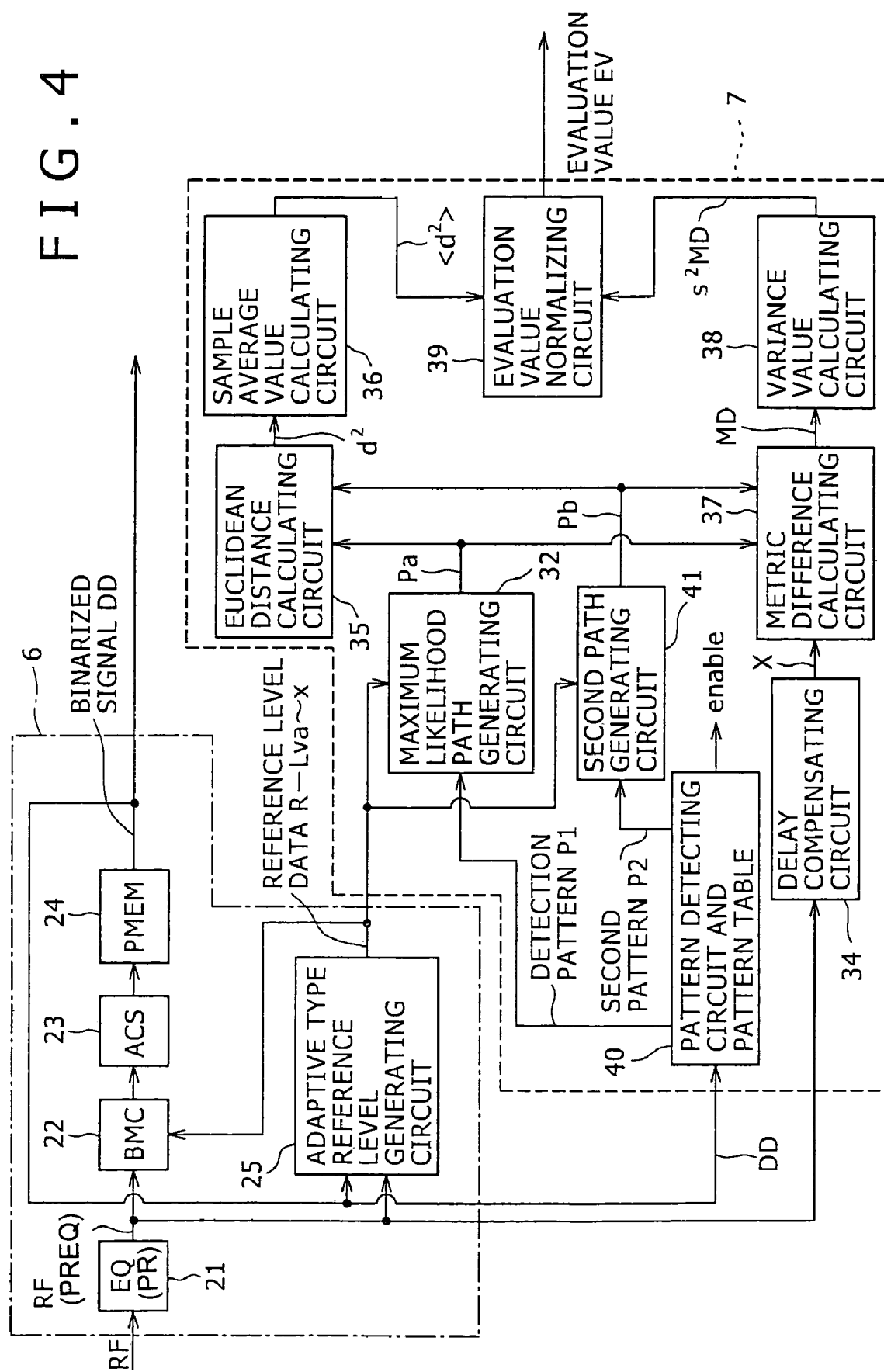
FIG. 4 is a block diagram showing an example of a configuration of a maximum likelihood decoding device according to a third embodiment.

FIG. 4 shows an example of configuration of a third embodiment.

Incidentally, in FIG. 4, the parts already described with reference to FIG. 2 are identified by the same reference numerals, and description thereof will be omitted. When the configuration of a PRML decoder 6 and a signal evaluator 7 shown in FIG. 4 is employed, the general configuration of the reproducing apparatus is the same as shown in FIG. 1.

The third embodiment identifies a type of error between a maximum likelihood path Pa and a second path Pb on the basis of a pattern table, whereas the first and second embodiments refer to the error determination result information JS to identify the error type.

In FIG. 4, the error determining unit 24a provided within the path memory updating unit 24 is omitted in the PRML decoder 6 in this case.

The signal evaluator 7 is provided with a pattern detecting circuit and pattern table, 40 as shown in FIG. 4. The pattern detecting circuit and the pattern table that the pattern detecting circuit refers to are shown integrally as the pattern detecting circuit and pattern table 40.

The pattern table in the pattern detecting circuit and pattern table 40 stores, in correspondence with a type of error as a target for calculation of an evaluation value EV, the patterns of bit sequences of the maximum likelihood path Pa and the second path Pb assumed when the error occurs.

The pattern detecting circuit compares the value of a binarized signal DD input, as shown in FIG. 4, with the value of the bit sequence of the maximum likelihood path Pa stored in the pattern table to determine whether these values coincide with each other. When the binarized signal DD coincides with the stored bit sequence of the maximum likelihood path Pa, the pattern detecting circuit supplies the pattern (that is, the binarized signal DD: the bit sequence of the maximum likelihood path Pa) as a detection pattern P1 shown in FIG. 4 to a maximum likelihood path generating circuit 32. On the basis of such a detection pattern P1, the maximum likelihood path generating circuit 32 in this case can also generate the maximum likelihood path Pa.

Together with this, the pattern detecting circuit supplies a second path generating circuit 41 with the pattern of the bit sequence of the second path Pb which pattern is stored in association with the pattern P1 in the pattern table as a second pattern P2 shown in FIG. 4.

In this case, the second pattern P2 is supplied as the information of the bit sequence of the second path Pb as it is to the second path generating circuit 41. Hence, unlike the second path generating circuit 33 shown in FIG. 2 and FIG. 3, the second path generating circuit 41 in this case does not require a function of generating the information of the bit sequence of the second path Pb on the basis of the binarized signal DD.

Further, when determining that the binarized signal DD coincides with the stored bit sequence of the maximum likelihood path Pa, as described above, the pattern detecting circuit supplies a signal enable shown in FIG. 4 to parts within the signal evaluator 7 (the maximum likelihood path generating circuit 32, the second path generating circuit 41, a Euclidean distance calculating circuit 35, a sample average value calculating circuit 36, a metric difference calculating circuit 37, and a variance value calculating circuit 38). Thereby these parts are activated by the signal enable only when the type of error of the second path Pb with respect to the maximum likelihood path Pa is an error type to be set as a target. That is, also in this case, the operation for calculating the evaluation value is performed only when the error type as the target is obtained as the type of error of the second path Pb with respect to the maximum likelihood path Pa. In other words, it is possible to prevent the Euclidean distance $d^2$ and the metric difference MD for the maximum likelihood path Pa and the second path Pb with a type of error other than the error type as the target from being reflected in the evaluation value, and thereby effectively prevent a decrease in the reliability of the evaluation value EV.

Incidentally, also in this case, it is possible to prevent a decrease in the reliability of the evaluation value when the values of the Euclidean distance $d^2$ and the metric difference MD calculated with the maximum likelihood path Pa and the second path Pb with a different type of error being mixed are not reflected in the evaluation value. Hence, it suffices to supply the signal enable to at least the sample average value calculating circuit 36 and the variance value calculating circuit 38.

Thus, in the third embodiment, since the patterns of the bit sequence of the maximum likelihood path Pa and the second path Pb assumed in an error type as a target are stored in advance, it can be estimated that the type of error of the second path Pb with respect to the maximum likelihood path Pa is the error type as the target when the stored pattern of the bit sequence of the maximum likelihood path Pa and the pattern of the binarized signal DD coincide with each other. In addition, at the same time, the information of the bit sequence of the second path Pb associated with the maximum likelihood path Pa can also be obtained.

Further, also in this case, a decrease in the reliability of the evaluation value EV is prevented because the evaluation value is calculated on the basis of the maximum likelihood path Pa and the second path Pb only when it is estimated that the type of error of the second path Pb with respect to the maximum likelihood path Pa is an error type as a target, as described above.

When the error determination result information JS is used as in the foregoing first and second embodiments, the error determining unit 24a is provided which determines whether the maximum likelihood path Pa and the second path Pb with a set type of error are actually obtained from the information of the bit sequences of the maximum likelihood path Pa and the second path Pb obtained within the path memory updating unit 24. Therefore, whether the type of error of the second path Pb with respect to the maximum likelihood path Pa is an error type as a target can be surely determined. When the pattern table in the third embodiment is used, on the other hand, whether relation between the maximum likelihood path Pa and the second path Pb belongs to the error type as a target is not actually confirmed. Thus, in this respect, reliability is considered to be lower.

However, the method using the pattern table has an advantage of eliminating a need for modifying the PRML decoder 6 because the error determining unit 24a as described above can be omitted.

Figure 5:
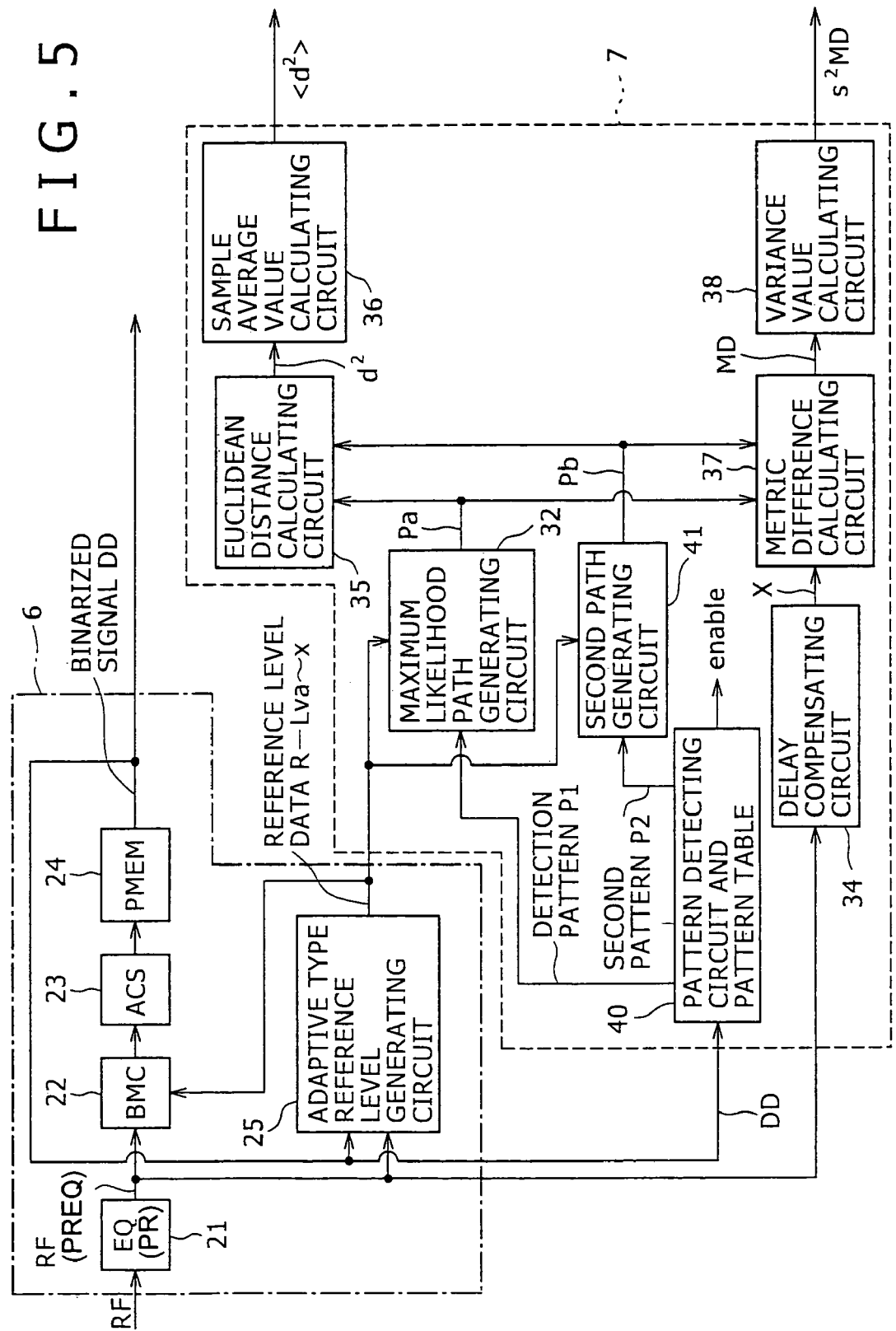
FIG. 5 is a block diagram showing an example of a configuration of a maximum likelihood decoding device according to a fourth embodiment.

FIG. 5 shows an example of configuration of a fourth embodiment.

Incidentally, in FIG. 5, the parts already described with reference to FIG. 2 and FIG. 4 are identified by the same reference numerals, and description thereof will be omitted.

The fourth embodiment has a configuration in which the pattern table in the foregoing third embodiment shown in FIG. 4 is used, and as in the foregoing second embodiment, the evaluation value normalizing circuit 39 is omitted, and an average value $<d^2>$ and a variance value $\sigma^2 MD$ are output as they are to the outside.

Also in this case, with such a configuration, the circuit area of a signal evaluator 7 can be effectively reduced.

The present invention is not limited to the embodiments described thus far.

For example, while in the embodiments, the reproducing apparatus performs reproduction supporting the recording medium 90 as an optical disk, the reproducing apparatus can be configured to perform reproduction supporting a magnetic disk such as a hard disk or the like, and a magneto-optical disk such as an MD (Mini Disc) or the like.

Alternatively, the maximum likelihood decoding device and the signal evaluating method according to embodiments of the present invention can be suitably applied not only to cases where a reproduced signal from a recording medium is evaluated but also to cases where signal quality is evaluated on a receiving device side in a transmission and reception system in which data communication is performed by wire or by radio.

It should be understood by those skilled in the art that various modifications, combinations, sub-combinations and alterations may occur depending on design requirements and other factors insofar as they are within the scope of the appended claims or the equivalents thereof.

What is claimed is:

1. A maximum likelihood decoding device comprising:
   Viterbi detecting means for performing bit detection by performing Viterbi detection from a reproduced signal in which bit information is reproduced, said Viterbi detecting means variably setting reference levels used for branch metric calculation according to level of said reproduced signal;
   Euclidean distance calculating means for calculating a Euclidean distance between a maximum likelihood path as a path surviving as a result of path selection by said Viterbi detecting means and a second path compared with the maximum likelihood path;
   metric difference calculating means for calculating a metric difference between a value of a path metric for said second path and a value of a path metric for said maximum likelihood path on a basis of said reproduced signal, said maximum likelihood path, and said second path;
   sample average value calculating means for sampling a value of the Euclidean distance between said maximum likelihood path and said second path, said Euclidean distance being calculated by said Euclidean distance calculating means, and calculating an average value of said Euclidean distance; and
   variance value calculating means for calculating a variance value of said metric difference calculated by said metric difference calculating means.

2. The maximum likelihood decoding device as claimed in claim 1, further comprising evaluation value normalizing means for obtaining an evaluation value for signal quality of said reproduced signal by normalizing the variance value of said metric difference, said variance value being calculated by said variance value calculating means, using the average value of said Euclidean distance, said average value being calculated by said sample average value calculating means.

3. The maximum likelihood decoding device as claimed in claim 1, further comprising:
   maximum likelihood path generating means for generating said maximum likelihood path on a basis of a binarized signal as a result of the bit detection by said Viterbi detecting means; and
   second path generating means for generating information of a bit sequence based on said second path on a basis of information on a predetermined error type set in advance as a type of error of said second path with respect to said maximum likelihood path, and generating said second path on a basis of the generated information of the bit sequence and said reference levels;
   wherein said Euclidean distance calculating means and said metric difference calculating means are supplied with said maximum likelihood path generated by said maximum likelihood path generating means and said second path generated by said second path generating means, and calculate said Euclidean distance and said metric difference, respectively.

4. The maximum likelihood decoding device as claimed in claim 1, further comprising:
   error determining means for determining whether a type of error of said second path with respect to said maximum likelihood path is a predetermined error type set in advance on a basis of information of a bit sequence of said maximum likelihood path and information of a bit sequence of said second path obtained by said Viterbi detecting means; and
   controlling means for performing control such that the average value of said Euclidean distance and the variance value of said metric difference are calculated only when a result of determination by said error determining means indicates that the type of error of said second path with respect to said maximum likelihood path is the predetermined error type set in advance.

5. The maximum likelihood decoding device as claimed in claim 1, further comprising:
- a pattern table for storing patterns of bit sequences of said maximum likelihood path and said second path, said patterns being assumed when a predetermined type of error set in advance occurs as a type of error of said second path with respect to said maximum likelihood path; and
- controlling means for performing control such that the average value of said Euclidean distance and the variance value of said metric difference are calculated only when a pattern of a binarized signal as a result of the bit detection by said Viterbi detecting means coincides with the pattern of the bit sequence of said maximum likelihood path, the pattern of the bit sequence of said maximum likelihood path being stored in said pattern table.

6. A signal evaluating method used by a maximum likelihood decoding device for evaluating signal quality of a reproduced signal in which bit information is reproduced, said signal evaluating method comprising the steps of:
- generating the reproduced signal by reading bit information recorded on a computer-readable medium and reproducing the read bit information;
- variably setting reference levels used for branch metric calculation according to level of said reproduced signal and performing bit detection by performing Viterbi detection from said reproduced signal using a Viterbi detector;
- calculating a Euclidean distance between a maximum likelihood path as a path surviving as a result of path selection in said Viterbi detecting step and a second path compared with the maximum likelihood path;
- calculating a metric difference between a value of a path metric for said second path and a value of a path metric for said maximum likelihood path on a basis of said reproduced signal, said maximum likelihood path, and said second path;
- sampling a value of the Euclidean distance between said maximum likelihood path and said second path, said Euclidean distance being calculated in said Euclidean distance calculating step, and calculating an average value of said Euclidean distance;
- calculating a variance value of said metric difference calculated in said metric difference calculating step; and
- obtaining an evaluation value for signal quality of said reproduced signal by normalizing the variance value of said metric difference, said variance value being calculated in said variance value calculating step, using the average value of said Euclidean distance, said average value being calculated in said sample average value calculating step.

7. A reproducing apparatus for performing at least reproduction on a recording medium, said reproducing apparatus comprising at least:
- a reproducing signal generating means for obtaining a reproduced signal by reading bit information recorded on said recording medium;
- Viterbi detecting means for performing bit detection by performing Viterbi detection from said reproduced signal obtained by said reproduced signal generating means, said Viterbi detecting means variably setting reference levels used for branch metric calculation according to level of said reproduced signal;
- demodulating means for obtaining reproduced data by demodulating bit information detected by said Viterbi detecting means; and
- signal evaluating means for obtaining an evaluation value for signal quality of said reproduced signal;
- wherein said signal evaluating means includes at least
- Euclidean distance calculating means for calculating a Euclidean distance between a maximum likelihood path as a path surviving as a result of path selection by said Viterbi detecting means and a second path compared with the maximum likelihood path,
- metric difference calculating means for calculating a metric difference between a value of a path metric for said second path and a value of a path metric for said maximum likelihood path on a basis of said reproduced signal, said maximum likelihood path, and said second path,
- sample average value calculating means for sampling a value of the Euclidean distance between said maximum likelihood path and said second path, said Euclidean distance being calculated by said Euclidean distance calculating means, and calculating an average value of said Euclidean distance, and
- variance value calculating means for calculating a variance value of said metric difference calculated by said metric difference calculating means.

8. A maximum likelihood decoding device comprising:
- a Viterbi detector performing bit detection by performing Viterbi detection from a reproduced signal in which bit information is reproduced, said Viterbi detector variably setting reference levels used for branch metric calculation according to level of said reproduced signal;
- a Euclidean distance calculator calculating a Euclidean distance between a maximum likelihood path as a path surviving as a result of path selection by said Viterbi detector and a second path compared with the maximum likelihood path;
- a metric difference calculator calculating a metric difference between a value of a path metric for said second path and a value of a path metric for said maximum likelihood path on a basis of said reproduced signal, said maximum likelihood path, and said second path;
- a sample average value calculator sampling a value of the Euclidean distance between said maximum likelihood path and said second path, said Euclidean distance being calculated by said Euclidean distance calculator, and calculating an average value of said Euclidean distance; and
- a variance value calculator calculating a variance value of said metric difference calculated by said metric difference calculator.

9. A reproducing apparatus for performing at least reproduction on a recording medium, said reproducing apparatus comprising at least:
- a reproducing signal generator obtaining a reproduced signal by reading bit information recorded on said recording medium;
- a Viterbi detector performing bit detection by performing Viterbi detection from said reproduced signal obtained by said reproduced signal generator, said Viterbi detector variably setting reference levels used for branch metric calculation according to level of said reproduced signal;
- a demodulator obtaining reproduced data by demodulating bit information detected by said Viterbi detector; and
- a signal evaluator obtaining an evaluation value for signal quality of said reproduced signal;
- wherein said signal evaluator includes at least
- a Euclidean distance calculator calculating a Euclidean distance between a maximum likelihood path as a path surviving as a result of path selection by said Viterbi detector and a second path compared with the maximum likelihood path, a metric difference calculator calculating a metric difference between a value of a path metric for said second path and a value of a path metric for said maximum likelihood path on a basis of said reproduced signal, said maximum likelihood path, and said second path, a sample average value calculator sampling a value of the Euclidean distance between said maximum likelihood path and said second path, said Euclidean distance being calculated by said Euclidean distance calculator, and calculating an average value of said Euclidean distance, and a variance value calculator calculating a variance value of said metric difference calculated by said metric difference calculator.

* * * * *